(12) United States Patent
Chien et al.

(10) Patent No.: US 9,951,778 B2
(45) Date of Patent: *Apr. 24, 2018

(54) PERMANENT MAGNET MOTOR PUMP

(71) Applicant: ASSOMA INC., Taoyuan (TW)

(72) Inventors: Huan-Jan Chien, Hsinchu County (TW); Chin-Cheng Wang, Yilan County (TW); Chih-Hsien Shih, Taoyuan (TW)

(73) Assignee: ASSOMA INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/236,306

(22) Filed: Aug. 12, 2016

(65) Prior Publication Data

US 2016/0348683 A1 Dec. 1, 2016

Related U.S. Application Data

(62) Division of application No. 13/657,518, filed on Oct. 22, 2012.

(30) Foreign Application Priority Data

Oct. 26, 2011 (TW) .............................. 100138846 A

(51) Int. Cl.
*F04D 15/00* (2006.01)
*F04D 7/06* (2006.01)
(Continued)

(52) U.S. Cl.
CPC ........... *F04D 13/0633* (2013.01); *F04D 7/06* (2013.01); *F04D 13/026* (2013.01);
(Continued)

(58) Field of Classification Search
CPC ............ F04B 2207/701; F04B 49/0651; F04C 2270/78; F04D 13/026; F04D 13/025;
(Continued)

(56) References Cited

U.S. PATENT DOCUMENTS 4,211,973 A 7/1980 Sato et al.
4,722,661 A * 2/1988 Mizuno ................. F04D 13/026
310/106
(Continued)

FOREIGN PATENT DOCUMENTS

JP 04051108 2/1992
JP 2001123996 A 5/2001
(Continued)

OTHER PUBLICATIONS

European Patent Office, "Office Action", dated Mar. 17, 2015, Germany.
Japan Patent Office, "Office Action", dated Feb. 4, 2014, Japan.

*Primary Examiner* — Dominick L Plakkoottam
(74) *Attorney, Agent, or Firm* — Maschoff Brennan

(57) ABSTRACT

A structural improvement of the canned pump is to improve the stiffness of a stationary shaft and, according to requirement, to dispose a monitor device. The method for improving the stiffness of the stationary shaft includes axially inserting a shaft metal rear support of the metal structural of a motor rear casing of a canned motor into the inner side of a rotor yoke of an inner rotor of the canned motor, tightly attaching the shaft metal rear support to a rear shaft seat for improving the stiffness of the stationary shaft by longer hold length, and for shortening an arm length of the composite force. The monitor device, used for detecting the wear of a bearing for enhancing the reliability and satisfying the driving requirement, is installed in the ring slot to be protected by the rear shaft seat.

16 Claims, 14 Drawing Sheets

(51) Int. Cl.

| | | |
|---|---|---|
| G01R 33/07 | (2006.01) | |
| F04D 29/22 | (2006.01) | |
| H02K 5/167 | (2006.01) | |
| H02K 11/215 | (2016.01) | |
| F04D 13/06 | (2006.01) | |
| F04D 29/046 | (2006.01) | |
| H02K 11/20 | (2016.01) | |
| F04D 13/02 | (2006.01) | |
| F04D 29/42 | (2006.01) | |
| F04B 49/06 | (2006.01) | |
| G01M 13/04 | (2006.01) | |

(52) U.S. Cl.
CPC ..... *F04D 13/0626* (2013.01); *F04D 15/0088* (2013.01); *F04D 15/0094* (2013.01); *F04D 29/046* (2013.01); *F04D 29/0465* (2013.01); *F04D 29/22* (2013.01); *F04D 29/4286* (2013.01); *G01R 33/07* (2013.01); *G01R 33/077* (2013.01); *H02K 5/1677* (2013.01); *H02K 11/20* (2016.01); *H02K 11/215* (2016.01); *F04B 49/065* (2013.01); *F04B 2207/70* (2013.01); *F04C 2270/78* (2013.01); *F05B 2240/14* (2013.01); *F05B 2240/52* (2013.01); *F05B 2280/4003* (2013.01); *G01M 13/04* (2013.01)

(58) Field of Classification Search
CPC ............ F04D 13/0626; F04D 13/0633; F04D 29/046; F16C 17/24; F16C 17/246; G01M 13/04; H02K 11/20; H02K 11/35
See application file for complete search history.

(56) References Cited

U.S. PATENT DOCUMENTS

| | | | | |
|---|---|---|---|---|
| 4,812,108 A | * | 3/1989 | Kotera | F04D 29/0413 415/111 |
| 4,924,180 A | * | 5/1990 | Nasr | F16C 17/24 324/207.15 |
| 5,336,996 A | * | 8/1994 | Rusnak | F04D 13/024 324/165 |
| 5,926,001 A | | 7/1999 | Eguchi | |
| 5,944,489 A | * | 8/1999 | Vaughn | F04D 15/0272 417/423.12 |
| 5,955,880 A | | 9/1999 | Beam | |
| 6,114,966 A | | 9/2000 | Eguchi | |
| 6,234,748 B1 | * | 5/2001 | Brown | F04D 29/041 415/170.1 |
| 6,429,781 B2 | | 8/2002 | Abe et al. | |
| 6,443,710 B1 | * | 9/2002 | Tatsukami | F04D 29/0413 417/365 |
| 7,019,661 B2 | * | 3/2006 | Misato | H02K 11/35 324/207.16 |
| 7,057,320 B2 | * | 6/2006 | Abordi | H02K 1/278 310/103 |
| 2001/0043865 A1 | * | 11/2001 | Rennett | F04D 29/0413 417/44.1 |
| 2003/0107368 A1 | * | 6/2003 | Sekiya | G01D 5/145 324/207.2 |
| 2010/0028176 A1 | * | 2/2010 | Platt | F04D 29/048 417/420 |
| 2010/0272592 A1 | | 10/2010 | Chien et al. | |

FOREIGN PATENT DOCUMENTS

| | | |
|---|---|---|
| JP | 2005-344589 A | 12/2005 |
| JP | 2005330908 A | 12/2005 |
| JP | 2005344589 A | 12/2005 |
| JP | 2008-220008 A | 9/2008 |
| JP | 2010261436 A | 11/2010 |
| JP | 2011052569 A | 3/2011 |
| TW | M369391 | 11/2009 |
| WO | 2008072438 A1 | 6/2008 |
| WO | 2011022557 A2 | 2/2011 |

* cited by examiner ns of U.S. patent application Ser. No. 13/657,518 filed on Oct. 22, 2012 and entitled "PERMANENT MAGNET MOTOR PUMP", which is a non-provisional application claims priority under 35 U.S.C. § 119(a) on Patent Application No(s). 100138846 filed in Taiwan, R.O.C. on Oct. 26, 2011, the entire contents of which are hereby incorporated by reference.

BACKGROUND

Technical Field

The invention relates to a sealless canned motor pump, more particularly to, an anti-corrosion and sealless canned motor pump including a bearing monitor device. The sealless canned motor pump comprises a canned motor and a pump integrated into one unit. An inner rotor and a stator windings of the motor are protected by an anti-corrosion material and are in direct contact with transferred fluid, such as chemical liquid in the PCB manufacturing device, is toxic, flammable and corrosive. The motor, including an induction motor (induction canned motor pump) or a permanent magnet pump (permanent magnet canned motor pump), are popular among industrial use requiring leakage-free. Moreover, the inner rotor of the sealless canned motor pump, in directly contact with the transferred fluid, comprise a slide bearing made of ceramic material, such as graphite, aluminum oxides or silicon carbides. However, the wear of the slide bearing may cause the inner rotor to rotate eccentrically so that a stationary shaft must bear greater centrifugal force and moment thereof, making the inner rotor and a containment shell collide with each other to be damaged and the fluid may be leaked. Therefore, the structure of the motor shaft system becomes one the focus of the design. A method for preventing leakage with high reliability is to dispose a bearing monitor device in the pump.

Therefore, the invention discloses a permanent magnet canned motor pump made of plastic or including a plastic liner in order to improve the structure stiffness of the stationary shaft and a monitor devise can be installed in the pump.

Related Art

A metal induction canned motor pump comprises a cylindrical can made of a metal thin plate with low magnetic permeability and anti-corrosion for encapsulating a inner rotor and a stator. The can is assembled inside the stator for isolating fluid and windings. Another metal plate is used for encapsulating a squirrel cage inner rotor to isolate the fluid as well. Therefore, air gap of the motor is a single-sided radial distance between a silicon-steel teeth part of the stator and a silicon-steel teeth part of the inner rotor. Most of the widths of the air gap are less than 3 millimeters (mm) so the motor characteristic of the above-mentioned motor is a motor structure with small air gap. The sealless canned motor pump which is adopted for transferring a clean and non-corrosive fluid, such as an automobile water cooling pump, are made with a heat-resisting plastic material with temperature resistance and limited anti-corrosion ability, such as polyphenylene sulfide (PPS) and the heat-resisting plastic material is used for encapsulating the stator and the inner rotor. The singled-sided encapsulation thickness of the heat-resisting plastic material is above 1.5 mm, and the width of the total air gap is above 4 mm. That is, the characteristic of the motor is a structure with bigger air gap. In order to transmit chemical fluid with high toxic and high corrosion, such as hydrofluoric acid, an anti-corrosion plastic component or liner, such as polypropene (PP), or fluoropolymer, are adopted for encapsulating the stator and the inner rotor. Because of the adoption of the anti-corrosion plastic material, the structure strength of the motor shaft system becomes one of the focuses of the design. The types of the motor system are divided into a rotary shaft and a stationary shaft. The invention provides a preferable stationary shaft system whose single-sided encapsulation thickness with allowance is above 3 mm and most of the width of the total air gap is above 7 mm so that the characteristic of the motor according to the invention is the motor structure with bigger air gap. Therefore, a permanent magnet synchronous motor is a preferable choice for the pump with bigger air gap. Although the sealless canned motor pump comprises a slide bearing made of ceramic material, the slide bearing may be worn because of the bearing wear, dry-running or excessive vibration. Therefore, disposing a monitor device monitoring the wear of the slide bearing is necessary to improve its reliability. Moreover, the monitor device may be a hall sensor so the driving method of the permanent magnet canned motor pump can drive with both sensor or sensorless method. Thus, the dependency of certain driver is reduced and user may have a wider choice of equipment.

The following cases are solutions to the problem of the sealless canned motor pump including stationary shaft structure, sensorless driving, sensor driving and bearing wear detection. The contents of the cases are described hereinafter:

Case 1:

Taiwan patent number: M369391 permanent magnet canned motor pump, 2009. The invention discloses a pump which is used in high-temperature and corrosive condition. A motor structure comprises a cantilever stationary structure and an inner motor with a radial air gap. The encapsulation thickness with corrosion allowance is 3 mm and the total air gap is 8 mm. A sensorless method disclosed in the invention is that calculating a magnetic pole position to drive the permanent magnet pump, and the stiff composited stationary structure satisfies the requirement for high temperature and high power usage. However, the structure of the invention does not have any bearing wear detecting ability.

Case 2:

Japan patent number JP2005344589A: CANNED MOTOR PUMP, which is a permanent magnet canned motor pump applied in engine cooling. A pump with low power in the invention is a simple stationary shaft structure. A ceramic shaft is supported by heat-resisting plastic components including a triangle front support and a pump containment shell. Second magnets and hall sensors are installed in the inner space of an inner rotor yoke of main magnets for detecting a magnetic pole position to drive the permanent magnet pump. The hall sensor extends outwardly from a bottom side of a containment shell. The magnets of the inner rotor also extend axially accordingly to reduce the independent extending length of the hall sensor. Since only clean fluid is transferred by the pump, it is not necessary to concern about the wear of the bearings. The simple stationary structure is adopted but the addition of the length of the magnets may increase the manufacturing cost, and only the magnetic flux which is scattered on a surface of the magnets are detected, it is unfavorable for detecting accurate magnetic pole position.

Case 3:

Japan patent number JP2008220008A: BRUSHLESS MOTOR AND FLUID PUMP DEVICE, 2008, which discloses a permanent magnet canned motor pump applied in engine cooling. A pump in the invention with low power is a simple stationary shaft structure. A ceramic shaft is supported by heat-resisting plastic components including a triangle front support and a pump containment shell. A hall sensor and a driving circuit board thereof are installed on the outside of the containment shell to drive the permanent magnet pump. Magnet extends axially to make a rear end of the magnet close to the hall sensor. Furthermore, the shape of the rear end of the magnet is processed into a slope shape, so that the magnetic flux of the magnet may pass in an oblique direction and through the hall sensor on the board for enhancing the accuracy of the detection of the magnetic pole position. Since only clean fluid is transferred by the pump, it is not necessary to concern about the wear of the bearings. The simple stationary structure is adopted but the addition of the length of the magnets may increase the manufacturing cost, and only the magnetic flux which is scattered on a surface of the magnets are detected, it is unfavorable for detecting accurate magnetic pole position.

Case 4:

U.S. Pat. No. 4,211,973A: Apparatus for detecting faults to be occurred or initially happening in a running electric rotary machine, 1980, which is applied in an induction canned motor pump. Signal coil pairs are long enough to cover the total length of a stator yoke. The signal coil pairs may output a periodic voltage signals including a synchronous induction voltage with main magnetic flux, and a inner rotor electromotive harmonic voltage due to a inner rotor slip. When a bearing is worn, the size of an air gap is slightly changed, and the voltage signals which is output by the signal coil pairs is varied accordingly. When the two signal coil pairs are at the opposite radial position of the teeth part of the stator respectively, the output voltage is neutralized by opposite main magnetic flux and leaves the periodic harmonic voltage. When the bearing is worn to cause the inner rotor to rotate eccentrically, the periodic harmonic voltage is increased, which is applied in an axial air gap induction motor and a radial air gap induction motor. Such method may be utilized to detect the problem of motor power or the motor winding, such as the unbalance problem of the three phase windings. But the invention is only used for detecting the wear of the radial bearing of the induction motor, not for detecting the wear of an axial thrust bearing.

Case 5:

U.S. Pat. No. 5,926,001A: Canned motor bearing wear monitor device, 1999, which is applied in an induction canned-motor pump. Four holes are formed in the inner side of four perpendicular teeth parts at each of two opposite end of a stator, respectively so that four of eight coils are installed in the respective holes at the one end and the other are installed at the opposite end. Each of the two corresponding holes at opposite end has the same special angle so that the eight coils may detect the radial wear, axial wear, oblique wear of a bearing.

Case 6:

U.S. Pat. No. 5,955,880A: Sealless pump inner rotor position and bearing monitor, 1999, which is applied in an induction canned-motor pump. Two coils and yokes with different magnetic poles form a high-frequency excitation coil set. The two coils are fixed on an outer surface of a can by the yokes in parallel to each other and at the axial position on an outer side of each end of a stator, respectively. The magnetic flux of the coil set passes through the can to and enters the outer space of the two ends of an inner rotor. Then the flux reversely returns back to the different magnetic pole coil via a magnetic conductive material on a plate at two side ends of the inner rotor of the shaft. Therefore, a closed-end magnetic circuit is formed, that is, the magnetic conductive material and the coil set are concentric to each other. The coil comprises three wires winding together and the one of the wires is used for exciting in high frequency to the other two wires to become the two signal wire. One of the signal wires is used for radial detection and the other is used for axial detection. When an axial wear happens on one side of a bearing, the radial position of the plate is moved in a radial direction, which causes the plate close to or away from the coil set. Therefore, the magnetic reluctance of the magnetic circuit is changed and the output voltage of the magnetic circuit is varied as well.

When four coil set perpendicular to each other are installed on the radial position, the radial wear of the bearing may be detected. When the coil sets and the plates are both installed on the two side of the inner rotor, the axial movement may be detected further. The signal processing of the axial detection is comparing two voltage signals from the coil sets at two sides of the inner rotor with each other for calculating the axial movement of the inner rotor. In addition, the high-frequency signal between 1K to 4K may prevent the harmonic signal interference of the coil. Moreover, in order to reduce the harmonic signal interference, a magnetic flux blocking device is further installed on a rear end of the stator coil.

Case 7:

U.S. Pat. No. 6,114,966A: Motor having a bearing wear monitor device, 2000, which is applied in an induction canned motor pump. The invention indeed indicates that disposing several signal coil pairs at two opposite ends of a stator may detect the radial wear of a bearing. However, when repairing a motor, including replacing a stator, a inner rotor, a spindle or signal coil pairs, a user may not make the mechanical axial positioning of the stator and the inner rotor to meet with their electrical axial positioning, or the user may not wind the coil to be positioned at the previous position, thereby generating an unusual signal. That is to say, the monitor device may adjust the relative positions and zeroing the signal of axial wear. The method is that because the thickness of the inner rotor is greater than that of the stator, when the motor is assembled, the distance between a inner rotor side of a shaft and a stator side of the shaft. The inner rotor side faces the center of the coil, the protrusion of the inner rotor protrudes from a rear end of the stator so a rear end of the inner rotor completely covers the coil without any radial allowance. Therefore, when the thrust bearing is worn and the inner rotor is moved forward, the coil signal at the front end is changed obviously, and the coil signal at the rear end is changed slightly.

Case 8:

U.S. Pat. No. 6,429,781B2: Axial bearing wear detector device for canned motor, 2002, which is applied to an induction canned motor pump. The device comprises a coil set which has two coils at two opposite teeth part of a stator, respectively, and forming a space angle of 180 degrees. Although the invention clearly indicates that disposing several signal coil pairs at the front and rear ends of the stator may detect the axial wear of a bearing, the axial lengths of wear rings which are installed at a front end and a rear end of a motor are greater than the axial lengths of thrust bearings which are installed at a front end and a rear end of the inner rotor. The inner rotor may be moved between the wear rings about ±2.5 mm in a free radial direction. A monitor device for detecting the axial wear of the bearing must distinguish abnormal axial movement of the inner rotor from normal axial movement of the inner rotor. In other words, the actual wear of the bearing needs to be detected. The invention enables a reference circuit and a dead spot circuit to be compared with each other in order to detect a coil signal for determining whether the axial movement of the inner rotor is within a normal range.

Case 9:

U.S. Pat. No. 7,019,661B2: Axial wear detector of bearing in canned motor, 2006, which is applied to an induction canned motor. The method for detecting coils in this invention is similar to the case 8. The invention clearly indicates that disposing several signal coil pairs at the front and rear ends of a stator may detect the axial wear of a bearing and generate a signal, and a wear value may be detected accurately when the signal is zeroed. However, the value of voltage signal which is output by the signal coil pairs may be affected by the operating voltage of the motor to cause the electromigration, thereby zeroing the signal difficultly. In other words, the wear value of the bearing is not accurate. The invention provides a method for processing the signal and a device thereof may zero the signal certainly.

The solution to the induction canned motor pump and the permanent magnet canned motor pump are divided into three types, shown as follows:

1. A monitor device is installed for detecting a bearing to improve the reliability of a pump.

2. A hall sensor is installed for driving a pump conveniently, but a magnet must be lengthened.

3. The stiffness of a stationary shaft is enhanced for improving the reliability of a pump.

The above-mentioned solutions to their corresponding problems may be feasible to be practiced, but the above-mentioned cases may not enhance the stiffness of the stationary shaft and dispose a monitor device for improving the reliability at the same time. A permanent magnet canned motor pump which is disclosed in this invention must overcome the following problems:

Problem 1: The weakness of the strength of a material.

Improve the structure strength to prevent the problem that the strength of an anti-corrosion plastic structure or liner is easily reduced when the temperature is above 85° C., and the reliability of a pump is improved without disposing a monitor device.

Problem 2: The requirement for detecting the wear of the bearing.

In order to satisfy the safety requirement for transmitting a high toxic and high corrosive chemical fluid, a monitor device is installed for detecting the wear condition of the bearing continuously to improve the reliability of the pump.

Problem 3: The low cost requirement for being with the motor characteristic of bigger air gap.

A permanent magnet motor is a preferable choice for the motor with bigger air gap, but a large amount of expensive magnets is needed. Increasing the length of the main magnet is used for providing a signal source of a monitor element. Therefore, the cost of the magnets is relatively increased.

Problem 4: Prevent a harmonic interference from the driving of a high frequency Pulse width modulation (PWM) signal of the permanent magnet motor.

The structure of the monitor device must the harmonic interference from the driving of a high frequency PWM electric power.

Problem 5: A requirement for receiving a signal with better quality when the monitor device is enabled.

The inner rotor of the canned motor pump has a larger axial free-movement space in high-anti-corrosion use, so the magnetic flux of the monitor device is easily bent and the drifting of signal which is due to the different voltage supply must be avoided.

Problem 6: The components are easily repaired and replaced.

When the component is repaired or replaced, the problem of the positioning or other personal factors must be avoided.

The present invention enhances the stiffness of the stationary shaft of a permanent magnet canned motor pump within any power range, under a reasonable cost, and a monitor device can be installed according to requirement. Therefore, the reliability is ensured and the life span is extended, and furthermore, the present invention is suitable for the simple stationary shaft structure and a composited shaft structure.

SUMMARY

The purpose of a permanent magnet canned motor pump, hereafter called the canned pump, which is disclosed in the present invention is to enhance the stiffness of a stationary shaft and a monitor device, such as a monitor device for detecting the wear of a front thrust bearing and a ceramic bearing or other monitor devices, is installed according to the requirement for enhancing the reliability of the pump or others. When the pump is used in a high-temperature and high-corrosive manufacturing process, the solution is described as follows:

The purpose of the canned pump is to enhance the stiffness of the stationary shaft and the monitor device is installed according to requirement. In order to enhance the stiffness of the stationary shaft, the method for the improvement of the stiffness of the stationary shaft includes axially inserting the shaft metal rear support of the metal structure of the motor rear casing of the canned motor into the inner diameter space of the rotor yoke of the inner rotor of the canned motor; isolating the corrosive fluid via the blank rear shaft support of the containment shell; tightly attaching the shaft metal rear support to the blank rear shaft support for improving the stiffness of the stationary shaft with longer holding length, and shortening the arm length of composite force. As a result, the structure reliability is improved due to the improvement of the stiffness of the stationary shaft. The blank rear shaft support of the containment shell has sufficient space in radial and axial directions for containing the monitor device, for example a monitor device for detecting wear of the front thrust bearing and the ceramic bearing, so that the reliability of the pump is ensured or other requirements are met. The monitor device includes the secondary magnets and the monitor set between which close-loop magnetic flux lines exist. The number of the secondary magnets is equal to that of the main magnets, and the volume of the secondary magnets is less than one tenth of that of the main magnets. The secondary magnets, which are installed on the inner side of the rotor yoke of the inner rotor and back onto main magnets, and the inner rotor are encapsulated for preventing them from the corrosion of the corrosive fluid so that the rotor yoke magnetic route and stator yoke magnetic route can coexist in the rotor yoke (i.e. the magnetic flux lines of the monitor device pass through the rotor yoke without being interfered.) In the case of using longer ceramic bearing for meeting loading requirement, longer rotor yoke is used, so that the secondary magnets can be assembled on the rotor yoke easily. The monitor set includes the secondary yoke and the monitor elements, and while the inner rotor rotates, the monitor elements cuts the magnetic flux lines to output the voltage signals, the containment shell protects the monitor set which is installed in the ring slot of the blank rear shaft support. The monitor elements can be signal coil pairs, which is used for monitoring the wear of the front thrust bearing and the ceramic bearing, or hall sensor, which is used for detecting the magnetic pole and driving the canned pump, so that the canned pump can be driven by either driven device without monitor device, hereafter called sensorless canned pump or driven device with monitor device, hereafter called sensor canned pump, and therefore, the convenience for the user to choose equipments is improved.

The axial length of the secondary magnets is over two times the length of the axial free movement of the inner rotor (including the axial wearing of the front thrust bearing and the ceramic bearing); the magnetic flux line emitted from a surface of secondary magnet and pass through air gap to a secondary yoke, continuing to the adjacent secondary magnet via backward field line, then, through rotor yoke to the original secondary magnet, thus forms closed loop. The monitor elements of the monitor set, for example the signal coil pairs and the hall sensor, is installed on the surface of the secondary yoke and is encapsulated as a set by the isolation material; the monitor set is installed in the ring slot of the bottom of the containment shell; the ring slot has an opening for making the monitor set be able to be assembled from the outer side to the bottom of the containment shell, the inner surface of the secondary yoke tightly fits the outer surface of the shaft metal rear support, the rear end of the secondary yoke has a alignment point and its electric angular position is connected to another alignment point at the axis of the shaft metal rear support of the motor rear casing, and, when the stator of the canned motor is assembled in the motor casing, connected to a reference point of the electric angular position of a windings stator.

In the monitor set having signal coil pairs, the width of the circumference of each signal coil is not greater than the electric included angle of 180 degrees although it varies with the number of the pole of the secondary magnets, each signal coil rotating at a sufficient rotation speed cuts the magnetic flux lines for outputting voltage signals. The signal coil pairs are divided into two groups which the phase difference of the space included angle between the two groups is 90 degrees. The arrangement of each group comprises a way that the phase difference of the space included angle between the two signal coil pairs in the same group is 180 degrees and another way that the two groups are installed in line axially face to. The rotation speed of the inner rotor, the centrifugal angle of the axis, the axial position and the radial position can be calculated after the operating the signals from the signal coil pairs. The centrifugal angle of the axis provides detailed information about the moving track. Compared with the position of the inner rotor, the amount of the wears of the front thrust bearing and the ceramic bearings is obtained. Moreover, a warning notice about the wear may be transmitted, or the operation of the pump is stopped by the monitor device. The output voltage of the signal coil pairs is reduced according to the inclination of the rotation speed of the inner rotor and is not applicable to a condition that the rated rotation speed is below forty percent, such as the rated rotation speed is 3000 rpm.

The invention will be further explained by the following structures some of which have monitor device and some of which don't, and those structures does not intend to limit this invention; other structures having the same function are also within the scope of this invention.

Strategy 1: The structural improvement of the canned pump is to improve the stiffness of the stationary shaft and, according to requirement, to install the monitor device. The method for the improvement of the stiffness of the stationary shaft includes axially inserting the shaft metal rear support of the metal structure of the motor rear casing of the canned motor into the inner space of the rotor yoke of the inner rotor of the canned motor; isolating the corrosive fluid via the blank rear shaft support of the containment shell; tightly attaching the shaft metal rear support to the blank rear shaft support for improving the stiffness of the stationary shaft by longer hold length, and for shortening the arm length of composite force. As a result, the structure reliability is improved due to the improvement of the stiffness of the stationary shaft.

Strategy 2: The inner side of the blank rear shaft support of the containment shell provides space for installing the monitor device, for example a monitor device for detecting wear of the front thrust bearing and the ceramic bearing, so that the reliability of the pump is ensured. The monitor device includes the secondary magnets and the monitor set, which forms a close-loop magnetic field. The secondary magnets are installed opposite to the main magnets on the inner side of the rotor yoke of the inner rotor in a corresponding position. The inner rotor is encapsulated to prevent corrosion from the corrosive fluid. The monitor set, which includes the secondary yoke and the monitor elements, is installed in the ring slot of the blank rear shaft support of the containment shell, so that the monitor set is protected by the containment shell. The monitor elements are, for example, signal coil pairs, for monitoring the wear of the front thrust bearing and the ceramic bearing.

Strategy 3: The monitor device in the inner space of the rotor yoke includes the secondary magnets and the monitor set. The volume of the secondary magnets is less than one tenth of that of the forward flux magnets so that the cost of the magnets is less than lengthening the forward flux magnets; in addition, when a longer ceramic bearing is used for withstanding higher loading, longer rotor yoke can be used and the secondary magnets can be assembled on the rotor yoke.

Strategy 4: The rotor yoke magnetic route, which is generated by the magnetic flux lines and harmonic waves formed by the high frequency PWM power source, passes through the rotor yoke. The rotor yoke shields the monitor device, which is installed in the inner space of the rotor yoke. The number of the secondary magnets of the monitor device is equal to that of the main magnets, and the secondary magnets are installed opposite to the main magnets on the inner side of the rotor yoke of the inner rotor in a corresponding position, so that rotor yoke magnetic route and stator yoke magnetic route can coexist in the rotor yoke (i.e. the magnetic flux lines of the monitor device pass through the rotor yoke without being interfered by those of the rotor yoke magnetic route.) the magnetic flux lines emitted from the surface of the secondary magnet and pass through the air gap to the secondary yoke, continuing to the adjacent secondary magnet via backward field lines, then, through rotor yoke to the original secondary magnet, thus forming a closed loop; the monitor elements cut the magnetic flux lines to output the voltage signals while the inner rotor rotates, so that the voltage signal is independent and is not affected by the outside voltage.

Strategy 5: the length of the ring-shape secondary yoke of the independent monitor device is longer than the sum of the axial length of the rotor yoke and the axial movement length of the inner rotor, and is longer than the total axial length of the signal coil pairs; the axial length of each signal coil is longer than 60% of that of secondary magnet; the total axial length of the signal coil pairs is longer than the sum of the axial length of the secondary magnets and the length of the axial free movement of the inner rotor, so that with the rotation of the inner rotor, the rotor yoke magnetic route remains stable without deformation while the secondary magnets may move axially, resulting in reliable signal outputs, and is not affected by external interferences. The amount of the magnetic flux lines cut by the signal coil pairs decreases proportionally with the axial movement of the inner rotor or the axial wear of the front thrust bearing and the ceramic bearing. The differential voltage between the voltage signals generated by the two signal coils opposite to each other is proportional to the radial displacement of the inner rotor or radial wear of the ceramic bearing.

Strategy 6: The rear end of the secondary yoke has an alignment point which is matched to another alignment point of the shaft metal rear support of the motor rear casing, and, when the stator of the canned motor is assembled in the motor casing, matching the alignment points, the electric position angle of the stator and rotor yokes would be aligned. The monitor elements and the yoke are encapsulated as a complete monitor set, thereby facilitating the maintenance and replacement and ensuring the correction of the magnetic positioning.

The invention will be further explained by the following structures some of which have monitor device and some of which don't, and those structures does not intend to limit this invention; other structures having the same function are also within the scope of this invention.

1. A sensorless canned pump, which needs a driver running in a sensorless mode to drive the pump:

(a) simple stationary shaft: the stationary shaft is adapted for general use with full power range and with low possibility of wear of the front thrust bearing and the ceramic bearing; the axially extended blank rear shaft support of the containment shell and the shaft metal rear support shorten the arm length of composite force, and the shaft metal rear support and the blank rear shaft support are tightly combined for improving the stiffness of the stationary shaft.

(b) composited stationary shaft: the stationary shaft is used in the field related to high power range and with low possibility of wear of the front thrust bearing and the ceramic bearing, working at high temperature, related to low NPSHr requirement; the axially extended blank rear shaft support of the containment shell and the shaft metal rear support shorten the arm length of composite force, and its the ceramic shaft sleeve are tightly pressed between the circular head of the metal shaft and the compressed surface of the shaft metal rear support by screws, thereby improving the stiffness of the stationary shaft.

2. A sensor canned pump, which needs a driver running in a sensorless mode to drive the pump:

(a) simple stationary shaft: the stationary shaft is adapted for general use with full power range and with high possibility of wear of the front thrust bearing and the ceramic bearing wear; the axially extended blank rear shaft support of the containment shell and the shaft metal rear support shorten the arm length of composite force, and the shaft metal rear support and the blank rear shaft support are tightly combined for improving the stiffness of the stationary shaft; the secondary magnets are installed opposite to the main magnets on the inner side of the rotor yoke of the inner rotor in a corresponding position, and the monitor set of the monitor device, which includes secondary yoke and signal coil pairs, is tightly fixed on the shaft metal rear support and is put into the ring slot of the blank rear shaft support of the containment shell for monitoring the wear of the front thrust bearing and the ceramic bearing; longer ceramic bearing is used in order to meet the requirement of heavy loading, and therefore longer rotor yoke can be employed and the secondary magnets can be installed on the rotor yoke.

(b) composited stationary shaft: the stationary shaft is adapted for general use with high power range and with high possibility of wear of the front thrust bearing and the ceramic bearing working at high temperature, related to low NPSHr requirement; the axially extended blank rear shaft support of the containment shell and the shaft metal rear support shorten the arm length of composite force, and its the ceramic shaft sleeve are tightly pressed between the circular head of the metal shaft and the compressed surface of the shaft metal rear support by screws, thereby improving the stiffness of the stationary shaft; the secondary magnets are installed opposite to the main magnets on the inner side of the rotor yoke of the inner rotor in a corresponding position, and the monitor set of the monitor device, which includes secondary yoke and signal coil pairs, is tightly fixed on the shaft metal rear support and is put into the ring slot of the rear shaft seat of the containment shell for monitoring the wear of the front thrust bearing and the ceramic bearing; longer ceramic bearing is used in order to meet the requirement of heavy loading, and therefore longer rotor yoke can be employed and the secondary magnets can be installed on the rotor yoke.

3. The structure of the monitor device:

The monitor device includes secondary magnets, which are installed opposite to the main magnets on the inner side of the rotor yoke of the inner rotor in a corresponding position, and monitor set, which includes the secondary yoke and the monitor elements, is tightly fixed on the shaft metal rear support and is put into the ring slot of the blank rear shaft support of the containment shell for monitoring the wear of the front thrust bearing and the ceramic bearing, and, the monitor element includes both the hall sensor and the signal coil pairs offer the driver running in a sensor mode, when the monitor element is only the signal coil pairs, a driver running in a sensorless mode is needed.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

First Embodiment

Figure 1A:
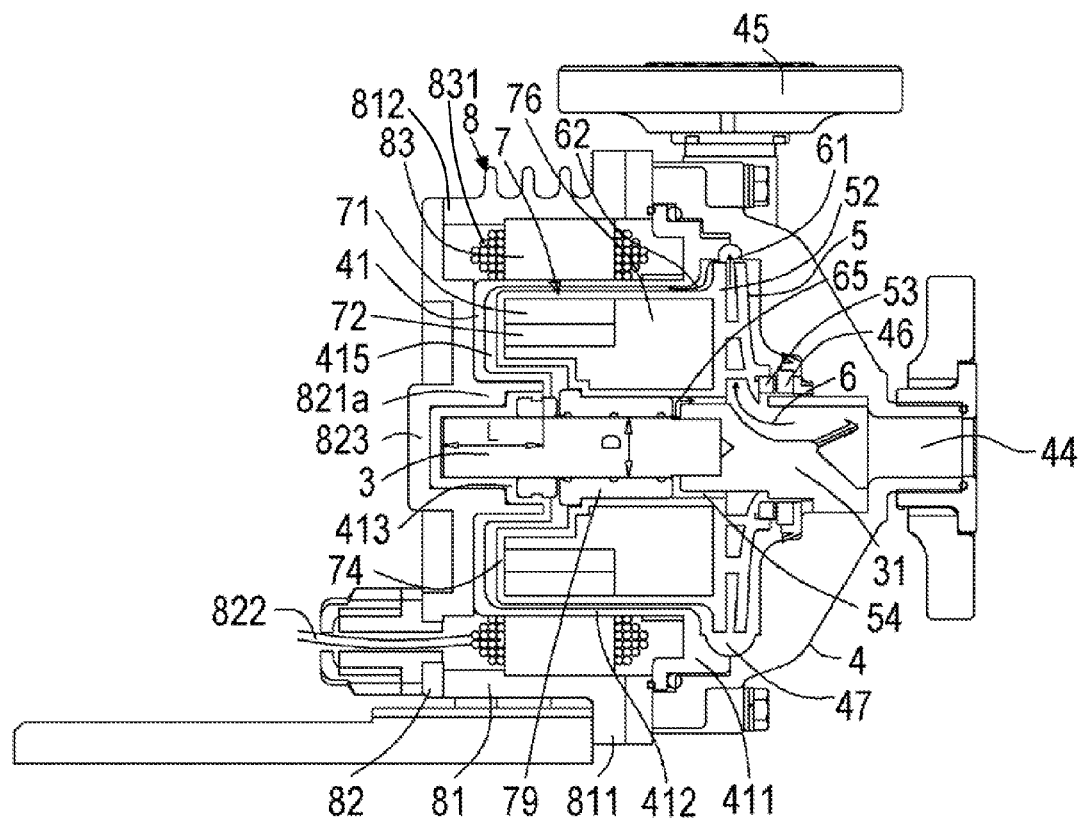
FIG. 1A is a cross-sectional view of a double-sided-supported stationary shaft without any monitor device of the canned pump according to the present invention.
Figure 3A:
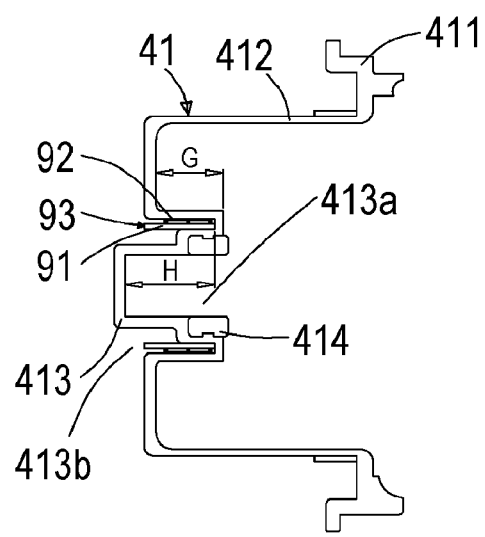
FIG. 3A is a cross-sectional view of a containment shell of a double-sided-supported stationary shaft of the canned pump according to the present invention.

The canned pump including a doubled-sided-supported stationary shaft without any monitor device as shown in FIGS. 1A and 3A.

With reference to FIG. 1A, 3A, FIG. 1A is a cross-sectional view of a double-sided-supported stationary shaft without any monitor device of the canned pump according to the present invention, and FIG. 3A is a cross-sectional view of a containment shell of a double-sided-supported stationary shaft of the canned pump according to the present invention. The canned pump comprises: a pump casing 4, a triangle front support 31, a type I impeller 5, a type I containment shell 41, a stationary shaft 3 and a canned motor 8.

The pump casing 4 includes an inlet 44, an outlet 45 and a flow channel 47, and is used for containing the type I impeller 5. A front thrust ring 46, installed on an inner side of the inlet 44 of the pump casing 4, is used for mating with a front thrust bearing 53 of the type I impeller 5 to form a front axial thrust bearing together.

The triangle front support 31, fixed with the inlet 44 of the pump casing 4, passes through a hub aperture 54 axially for supporting an end of the stationary shaft 3.

The type I impeller 5 is assembled in the pump casing 4. The triangle front support 31 may pass through the hub aperture 54 axially and is used for supporting the end of the stationary shaft 3. A hub plate 52 is used for combining an axially extended part 76 of an inner rotor 7 of the canned motor 8 so that the type I impeller 5 and the inner rotor 7 are integrated into one piece or embedded to be combined into one piece.

The type I containment shell 41 is a cup-shaped shell structure with a blank rear shaft support 413 installed on a bottom side of the type I containment shell 41. There is no any through hole on the blank rear shaft support 413 with a ring slot 413b for ensuring there is no leakage from the type I containment shell 41. A shell flange part 411, installed on a front side of the type I containment shell 41, is combined with the pump casing 4 and a pump side flange 811 of the canned motor 8 for preventing a corrosive fluid from leakage. A shell column part 412, installed on a lateral side of the type I containment shell 41, passes through the inner side of a stator 83 with a loose slide fit. A motor rear casing 82 of the canned motor 8 is tightly attached on the bottom side of the type I containment shell 41 with sufficient supporting strength. The blank rear shaft support 413 is installed at the center of the bottom side of the type I containment shell 41 and extends inwardly and axially to an inner space of a rotor yoke 72. The blank rear shaft support 413 includes a shaft hold hole 413a protruding inwardly and positioned in the blank rear shaft support 413, and includes a ring slot 413b installed on the outer side of the blank rear shaft support 413. A rear thrust ring 414 is installed on front surface of the shaft hold hole 413a and is used for mating with a ceramic bearing 79 of the inner rotor 7 to form the rear axial thrust bearing. An outer sidewall surface of the shaft hold hole 413a is completely combined with and supported by a shaft metal rear support 821a of the motor rear casing 82, and a bottom side of the shaft hold hole 413a is completely fitted with the inner side of a backward bulged part 823 of the motor rear casing 82, and the length of the bulged part 823 is fitted with the depth H of the shaft hold hole 413a for providing the high-stiff support for the stationary shaft 3, and hereafter this kind of structure is called a metal holding support. The type I containment shell 41 is only used for providing anti-corrosion isolating property without providing stiff support for the stationary shaft 3.

The stationary shaft 3, which is a double-sided supported structure, is made of a ceramic material with anti-corrosion and anti-wear properties. A front side of the stationary shaft 3 is supported by the triangle front support 31 and a rear side of the stationary shaft 3 is supported by the blank rear shaft support 413 which extends outwardly. A center portion of the stationary shaft 3 mates with the ceramic bearing 79 for supporting the rotation of the inner rotor 7, and the length of the center portion of the stationary shaft 3 satisfies the length of ceramic bearing 79 so that the length of the center portion is favorable for withstanding a composite force which is borne by the inner rotor 7 and reserving an axial free-movement space for the inner rotor 7. The ring slot 413b of the blank rear shaft support 413 is tightly combined with and supported by the shaft metal rear support 821a of the motor rear casing 82 and provides a hold length L. Moreover, the ring slot 413b may overcome the problem of the reduced strength of plastic material due to the rise of the temperature.

The canned motor 8 comprises the stator 83, a motor casing 81, a motor rear casing 82 and the inner rotor 7.

The stator 83 is tightly fixed in the motor casing 81. Windings 831 are winded on the stator 83. A PWM electric power, applied on the windings 831, generates a magnetic flux to interact with a magnetic field of the inner rotor 7, the inner rotor 7 generates torque and rotates to drive the type I impeller 5 to output hydraulic power. The type I containment shell 41 prevents the windings 831 of the stator 83 from being corroded by the corrosive fluid.

The pump side flange 811 of the motor casing 81 is used for tightly fixing with the shell flange part 411 and the pump casing 4 to prevent the leakage from the corrosive fluid. A back flange of the motor casing 81 is used for fixing the motor rear casing 82 to provide a complete structure support so that the shaft metal rear support 821a of the motor rear casing 82 may provide support needed by the stationary shaft 3.

The motor rear casing 82 is fixed with the back flange of the motor casing 81 so that the shaft metal rear support 821a of the motor rear casing 82 may provide support needed by the stationary shaft 3. An electric power wire of the windings 831 of the stator 83 is connected to a drive power via a lead port 822.

The inner rotor 7 is a ring-shaped structure comprising main magnets 71, the rotor yoke 72 and the axially extended part 76 and forming a ring-shaped rotor resin enclosure 74 covered with an engineering plastic with anti-corrosion property. A ceramic bearing 79 is installed in a central hole of the inner rotor 7. The hub plate 52 is used for combining with the axially extended part 76 of the inner rotor 7 so that the type I impeller 5 and the inner rotor 7 are integrated into one piece or embedded to be combined with each other into one piece.

When the pump operates, fluid flows along an inlet streamline 6 and is pressurized after flowing through the type I impeller 5, such as an impeller exit streamline 61. The pressurized fluid is output by an outlet 45 and a portion of the fluid, such as a turn back streamline 62, enters the inner space 415 of the type I containment shell 41 via a rear side of the type I impeller 5. After that, the fluid flows to the gap between an outer side of the inner rotor 7 and the inner space 415 of the type I containment shell 41, continuing through another gap between the stationary shaft 3 and the ceramic bearing 79. Then, the fluid flows through the hub aperture 54, such as an end lubrication streamline 65, to an inlet of the type I impeller 5. The circulating flowing of the fluid is used for providing the lubrication for the ceramic bearing 79 and taking away the heat generated by the inner rotor 7.

Second Embodiment

Figure 1B:
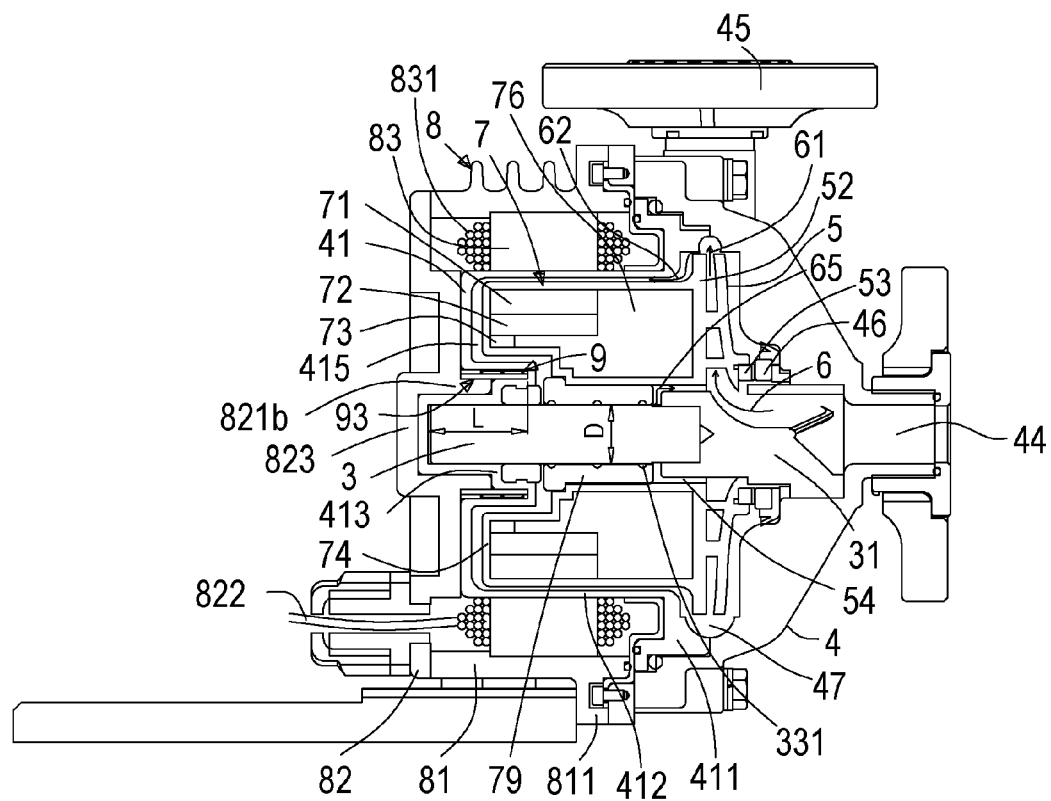
FIG. 1B is a cross-sectional view of a double-sided supported stationary shaft with a monitor device of the canned pump according to the present invention.
Figure 1C:
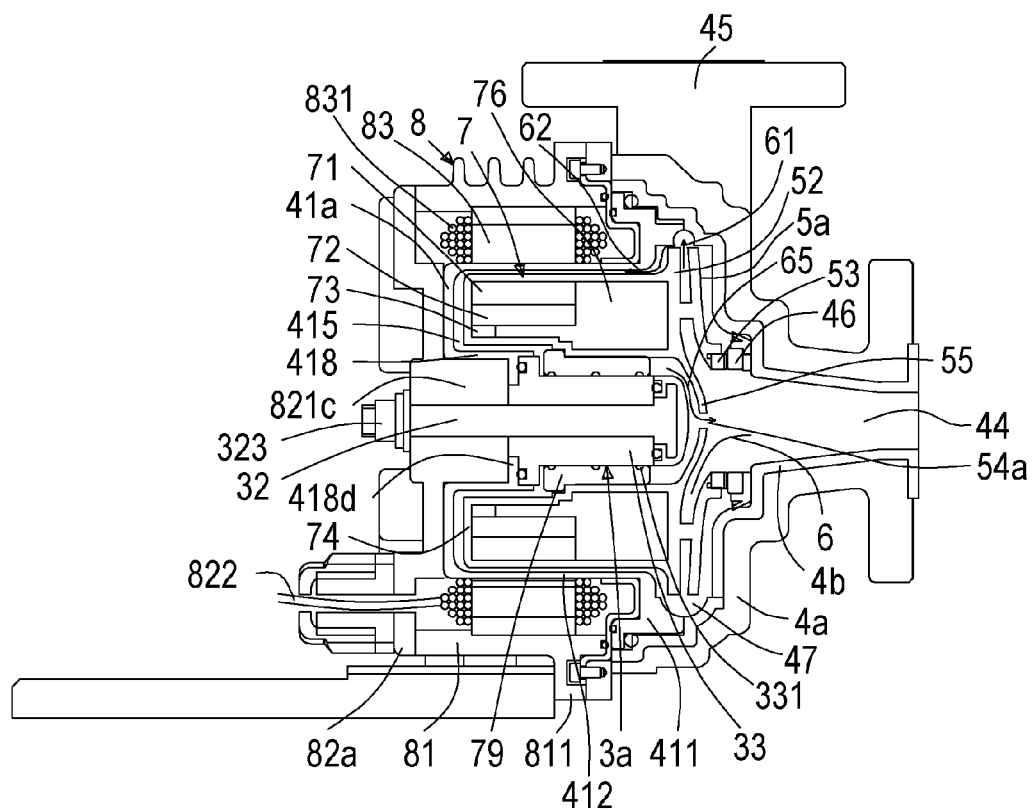
FIG. 1C is a cross-sectional view of a single-sided-supported cantilever composited stationary shaft without any monitor device of the canned pump according to the present invention.
Figure 1D:
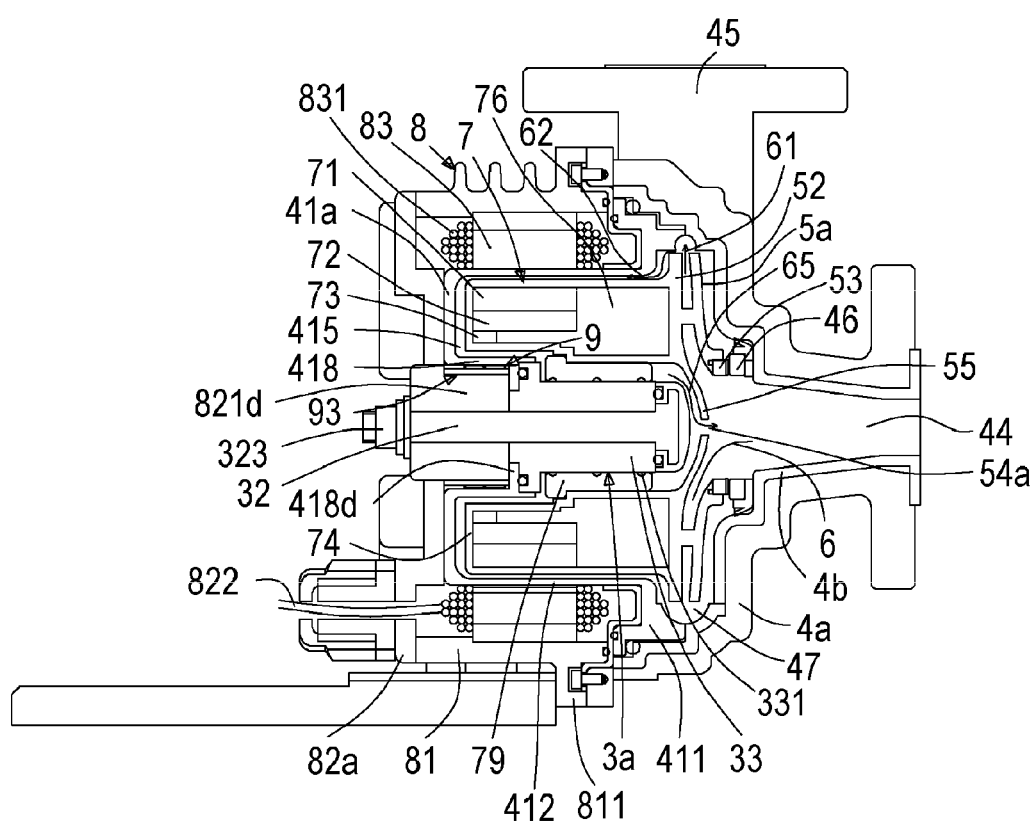
FIG. 1D is a cross-sectional view of a single-sided-supported cantilever composited stationary shaft with a monitor device of the canned pump according to the present invention.
Figure 3B:
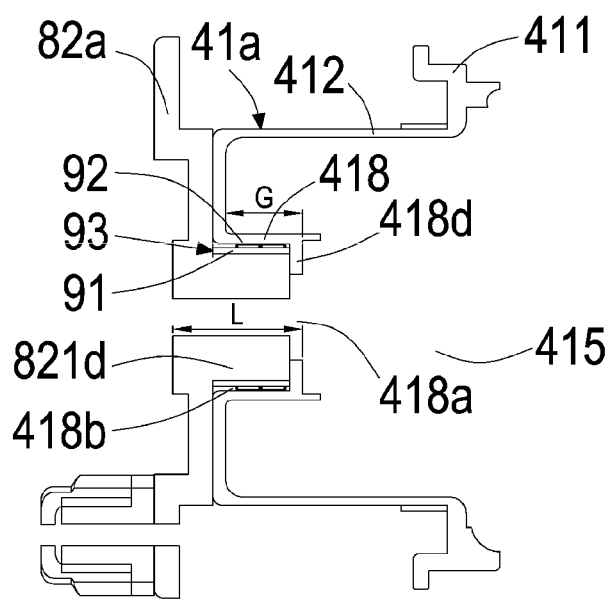
FIG. 3B is a cross-sectional view of a containment shell of a cantilever stationary shaft of the canned pump according to the present invention.
Figure 5A:
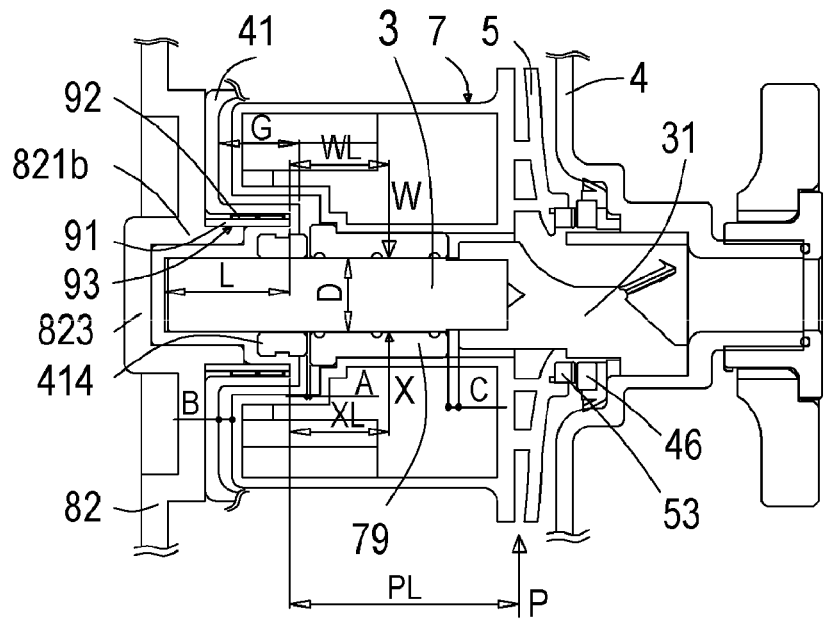
FIG. 5A shows a inner rotor bearing multiple forces and moments thereof on a double-sided-supported stationary shaft according to the present invention.
Figure 5B:
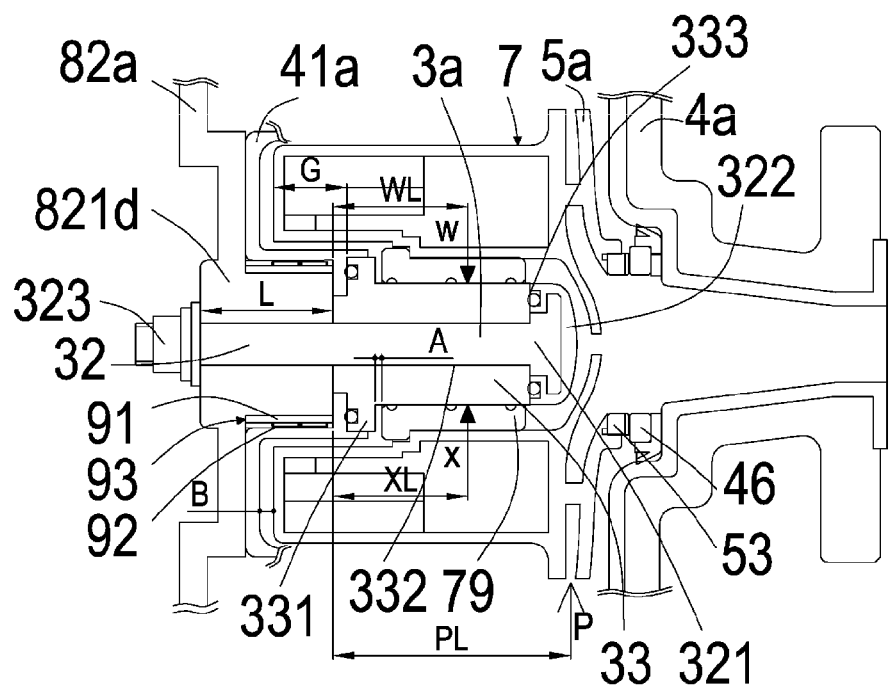
FIG. 5B shows a inner rotor bearing multiple forces and moments thereof on a single-sided-supported cantilever stationary shaft according to the present invention.

The canned pump including a singled-sided-supported cantilever composited stationary shaft without any monitor device which is shown as in FIG. 1C, FIG. 3B and FIG. 5B.

With reference to FIG. 1C and FIG. 3B, FIG. 1Ac is a cross-sectional view of a single-sided-supported composited stationary shaft without any monitor device of the canned pump according to the present invention, FIG. 3B is a cross-sectional view of a containment shell of a cantilever stationary shaft of the canned pump according to the present invention, and FIG. 5B shows an inner rotor bearing multiple forces and moments thereof on a single-sided-supported cantilever stationary shaft according to the present invention. The canned pump comprises a metal casing 4a, a type II impeller 5a, a type II containment shell 41a, a composited stationary shaft 3a and a canned motor 8.

The metal casing 4a which includes an inlet 44, an outlet 45 and a flow channel 47 is used for containing the type II impeller 5a. The metal casing 4a is a metal wok structure by casting. A casing liner 4b, made of anti-corrosive plastic, is covered on an inner side of the metal casing 4a. A front thrust ring 46, installed at the inlet 44 in an inner side of the metal casing 4a, is used for mating with a front thrust bearing 53 of the type II impeller 5a to form a front axial thrust bearing.

The type II impeller 5a is installed in the metal casing 4a. A hub plate 52 is used for being combined with an axially extended part 76 of an inner rotor 7 so that the type II impeller 5a and the inner rotor 7 are integrated into one piece or embedded with each other into one piece. A hub balance hole 54a is a aperture at the center of a curve hub plate 55 for making circulating fluid re-circulate, for example, an end lubrication streamline 65. The inlet 44 of the metal casing 4a and the inlet of the type II impeller 5a form a smooth and increasing—inner-diameter channel without any disturbance, and the shape of the curve hub plate 55 is smooth curve shape as well. Therefore, it is favorable for reducing the flow speed of the fluid to make sure the pump has good NPSHr ability.

The type II containment shell 41a is a cup-shaped structure which has a rear shaft seat 418 including a hole installed on a bottom side of the type II containment shell 41a. A shell flange part 411, installed on a front side of the type II containment shell 41a, is combined with the metal casing 4a and a pump side flange 811 of the canned motor 8, which prevents the fluid from leakage. A shell column part 412, installed on a lateral side of the type II containment shell 41a, passes through the inner side of the stator 83 with a loose slide fit. Also, the bottom side of the type II containment shell 41a is tightly attached to the motor rear casing 82 with sufficient supporting strength. The rear shaft seat 418, installed on the center on the bottom side of the type II containment shell 41a, extends inwardly towards the inner space of the rotor yoke 72, and the rear shaft seat 418 further protrudes inwardly and includes an aperture 418a installed at an inner side of the rear shaft seat 418 and a concave aperture 418b installed on an outer side of the rear shaft seat 418 corresponding to each other, and the aperture, installed on the center of the rear shaft seat 418, is used for containing the composited stationary shaft 3a, and a seal surface 418d of the rear shaft seat 418 is tightly attached by a surface of a ceramic shaft sleeve 33 including an O ring and a shaft metal rear support 821a of the motor rear casing 82, and hereafter this kind of structure is called metal composited support, which may make sure that there is no leakage. This embodiment does not have any monitor device to provide a detection device for detecting the wear of the front thrust bearing 53 and the ceramic bearing 79.

The composited stationary shaft 3a, which is a cantilever supported structure, is made of a ceramic shaft sleeve 33, a metal shaft 32 and a motor rear casing 82 with anti-corrosion and anti-wear properties. The composited stationary shaft 3a and the type II containment shell 41a form a completely sealed shaft system. When an end of the composited stationary shaft 3a is installed on a composited shaft metal rear support 821c of the motor rear casing 82, a required supporting strength is provided. The metal shaft 32 passes through a sleeve central hole 332 of the ceramic shaft sleeve 33, and includes a circular head 321 which is installed at an end of the metal shaft 32 and pressed tightly against a front end surface 333 of the ceramic shaft sleeve 33. A teeth part 323 of the metal shaft 32 passes through the rear shaft seat 418 of the type II containment shell 41a and a central hole of the composited shaft metal rear support 821c which is extended inwardly in a radial direction. A nut of the teeth part 323 is fixed on the motor rear casing 82a so that a sliding thrust surface 331 of the ceramic shaft sleeve 33 is tightly pressed against a surface of the composited shaft metal rear support 821c. A circular head 321 of the metal shaft 32 is covered with a resin enclosure 322, and an O ring is installed on the circular head 321 which is used for sealing and corrosion resistance. The sliding thrust surface 331 of the ceramic shaft sleeve 33 is used for mating with a ceramic bearing 79 of the inner rotor 7 to form a rear axial thrust bearing. A surface of the sliding thrust surface 331 and a surface of the composited shaft metal rear support 821c of the motor rear casing 82a are tightly fixed and compressed with each other and a seal surface 418d of the rear shaft seat 418, packed tightly and installed between the sliding thrust surface 331 and the composited shaft metal rear support 821c is encapsulated by a surface of the sliding thrust surface 331 including another 0 ring, which makes sure there is no leakage, thereby forming a composited stationary shaft 3a with high stiffness.

The canned motor 8 comprises the stator 83, a motor casing 81, a motor rear casing 82a and an inner rotor 7.

The stator 83 is tightly fixed in the motor casing 81. Windings 831 are winded on the stator 83. A PWM electric power, applied on the windings 831, may generate a magnetic flux to interact with a magnetic field of the inner rotor 7, so the inner rotor 7 generates torque and rotates to drive the type II impeller 5a to output hydraulic power. The type II containment shell 41a prevents the windings 831 of the stator 83 from being corroded by the corrosive fluid.

The pump side flange 811 which is installed on a lateral pump side of the motor casing 81 is used for fixing with the shell flange part 411 and the metal casing 4a for preventing corrosive fluid from leakage. A back flange of the motor casing 81 is used for fixing with the motor rear casing 82a to provide a complete structure support so that the composited shaft metal rear support 821c of the motor rear casing 82a may provide support which is required by the composited stationary shaft 3a.

The motor rear casing 82a is tightly fixed with the back flange of the motor casing 81 so that the composited shaft metal rear support 821c of the motor rear casing 82a may provide support which is required by the composited stationary shaft 3a. An electric power wire of the windings 831 of the stator 83 is connected to a drive power via a lead port 822.

The inner rotor 7 is a ring-shaped structure comprising main magnets 71, a rotor yoke 72 and an axially extended part 76 and forming a ring-shaped rotor resin enclosure 74 which is covered with an engineering plastic with anti-corrosion property. A ceramic bearing 79 is installed in a central hole of the inner rotor 7. The hub plate 52 is used for combining with the axially extended part 76 of the inner rotor 7 so that the type II impeller 5a and the inner rotor 7 are integrated into one piece or embedded to be combined with each other into one piece.

When the pump operates, fluid flows along an inlet streamline 6 and is pressurized after flowing through the type II impeller 5a, such as an impeller exit streamline 61. The pressurized fluid is output by an outlet 45, and a portion of the fluid, such as a turn back streamline 62, enters the inner space 415 of the type II containment shell 41a via a rear side of the type II impeller 5a in the mean time. After that, the fluid flows to the gap between an outer side of the inner rotor 7 and the inner space 415 of the type II containment shell 41a, continuing through another gap between of the composited stationary shaft 3a and the ceramic bearing 79. Then, the fluid flows through a hub balance hole 54a which is installed at the center of the curve hub plate 55, such as an end lubrication streamline 65, to an inlet of the type II impeller 5a. The circulating flowing of the fluid is used for providing the lubrication for the ceramic bearing 79 and taking away the heat generated by the inner rotor 7.

Third Embodiment

Figure 1E:
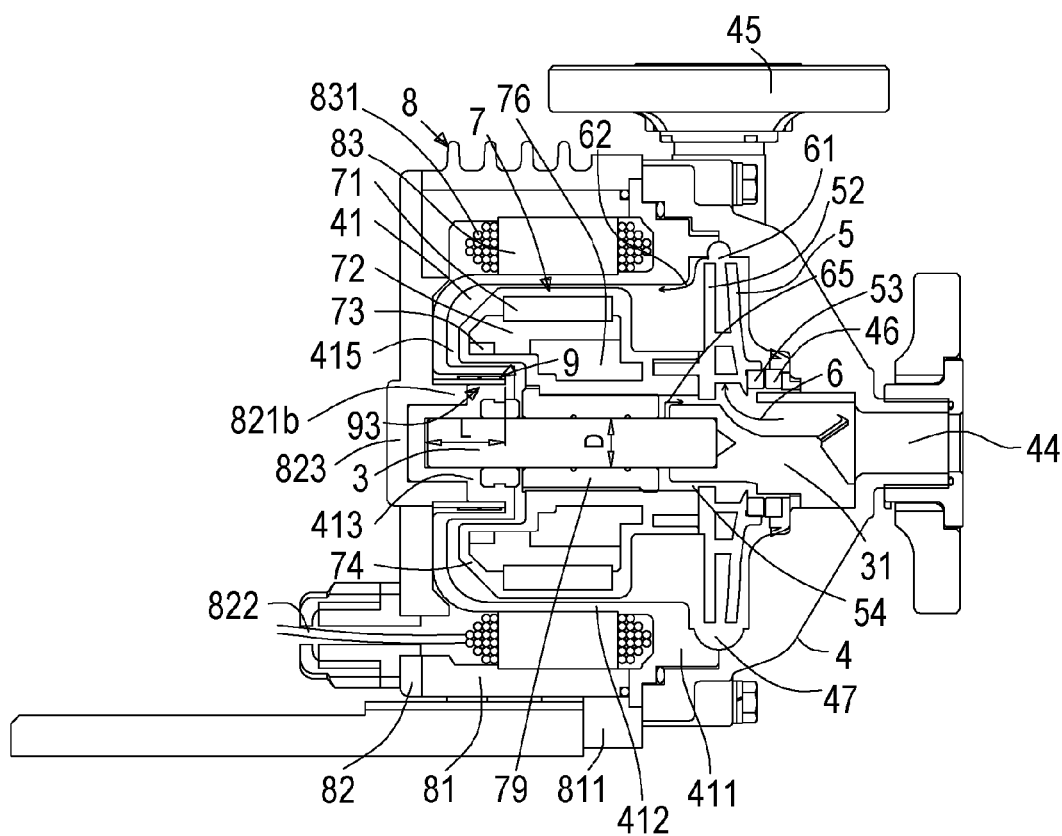
FIG. 1E is a cross-sectional view of a double-sided-supported stationary shaft with a monitor device and with a lengthened ceramic bearing of the canned pump according to the present invention.

The canned pump including a doubled-sided-supported cantilever composited stationary shaft and a monitor device shown in FIGS. 1B, 1E and FIG. 3A.

With reference to FIG. 1B, 1E and FIG. 3A, FIG. 1B is a cross-sectional view of a double-sided supported stationary shaft with a monitor device of the canned pump according to the present invention, FIG. 1E is a cross-sectional view of a double-sided-supported stationary shaft with a monitor device and with a lengthened ceramic bearing of the canned pump according to the present invention, and FIG. 3A is a cross-sectional view of a containment shell of a double-sided-supported stationary shaft of the canned pump according to the present invention. The canned pump comprises a pump casing 4, a triangle front support 31, a type I impeller 5, a type I containment shell 41, a monitor device 9, a stationary shaft 3 and a canned motor 8.

The pump casing 4 includes an inlet 44, an outlet 45 and a flow channel 47, and is used for containing the type I impeller 5. A front thrust ring 46 is installed on an inner side of the inlet 44 of the pump casing 4 and used for mating with a front thrust bearing 53 of the type I impeller 5 to form a front axial thrust bearing together.

The triangle front support 31 is fixed on the inlet 44 of the pump casing 4, passes through a hub aperture 54 axially and is used for supporting an end of the stationary shaft 3.

The type I impeller 5 is assembled in the pump casing 4. The triangle front support 31 may pass through the hub aperture 54 axially and is used for supporting the end of the stationary shaft 3. A hub plate 52 is used for combining an axially extended part 76 of an inner rotor 7 of the canned motor 8 so that the type I impeller 5 and the inner rotor 7 are integrated into one piece or embedded to be combined into one piece.

The type I containment shell 41 is a cup-shaped shell structure comprising a blank rear shaft support 413 installed on a bottom side of the type I containment shell 41. There is no any through hole on the blank rear shaft support 413 with a ring slot 413b for ensuring there is no leakage from the type I containment shell 41. A shell flange part 411, installed on a front side of the type I containment shell 41, is combined with the pump casing 4 and a pump side flange 811 of the canned motor 8 for preventing a corrosive fluid from leakage. A shell column part 412, installed on a lateral side of the type I containment shell 41, passes through in the inner side of a stator 83 with a loose slide fit. A motor rear casing 82 of the canned motor 8 is tightly attached on the bottom side of the type I containment shell 41 with sufficient support strength. The blank rear shaft support 413 is installed at the center of the bottom side of the type I containment shell 41 and extends inwardly and axially to an inner space of a rotor yoke 72. The blank rear shaft support 413 includes a center shaft hold hole 413a protruding inwardly, and the ring slot 413b is on the outer side of the blank rear shaft support 413. A rear thrust ring 414 is installed on front surface of the shaft hold hole 413a and is used for mating with a ceramic bearing 79 of the inner rotor 7 to form a rear axial thrust bearing. The monitor set 93, which includes a secondary yoke 91 and multiple signal coil pairs 92 served as multiple monitor elements, is installed on the monitoring shaft metal rear support 821b of the motor rear casing 82, and put into the ring slot 413b of outer sidewall surface of the shaft hold hole 413a. A bottom side of the blank rear shaft support 413 is completely fitted with the inner side of a bulged part 823 of the motor rear casing 82. The length of the bulged part 823 is fitted with the depth H of the shaft hold hole 413a for providing the high-stiff support of the stationary shaft 3. The type I containment shell 41 is only used for providing anti-corrosion isolating ability without providing stiff support for the stationary shaft 3.

The monitor device 9, positioned in the ring slot 413b of the blank rear shaft support 413 which extends axially, is used for detecting the wear of the front thrust bearing 53 and the ceramic bearing 79. The structure of the monitor device 9 comprises multiple secondary magnets 73 and a monitor set 93. The number of the secondary magnets 73 is the same as the main magnets 71. The secondary magnets 73 are assembled at one end of the inner side of a rotor yoke 72 of the inner rotor 7 in the vicinity of the bottom side of the type I containment shell 41 as well as face oppositely away from the main magnets 71. The axial length of the secondary magnets 73 is at least more than twice as great as the length of an axial movement (including the axial wear of the front thrust bearing 53 and the ceramic bearing 79) of the inner rotor 7. The monitor set 93 comprises the secondary yoke 91 (not shown) and the multiple signal coil pairs 92 served as the multiple monitor elements. The secondary yoke 91 take the position at the center of the secondary magnets 73 as a reference point, the axial length of the secondary yoke 91 is divided into two sections, a front section and a rear section. When the secondary magnets 73 are moved axially, both ends of the secondary magnets 73 do not exceed the ranges of the two sections of the secondary yoke 91.

The stationary shaft 3 is the doubled-sided supported structure made of ceramic material with anti-corrosion and anti-wear properties. A front side of the stationary shaft 3 is supported by the triangle front support 31 and a rear side of the stationary shaft 3 is supported by the blank rear shaft support 413 which extends outwardly. A center portion of the stationary shaft 3 mates with the ceramic bearing 79 for supporting the rotation of the inner rotor 7, and the length of the center portion of the stationary shaft 3 satisfies the length of ceramic bearing 79 and reserves an axial free-movement space for the inner rotor 7. The ring slot 413b of the blank rear shaft support 413 is tightly combined with and supported by the monitoring shaft metal rear support 821b of the motor rear casing 82 and provides a hold length L. Moreover, the ring slot 413b may overcome the problem of the reduced strength of plastic material due to the rising of the temperature.

The canned motor 8 comprises the stator 83, a motor casing 81, the motor rear casing 82 and the inner rotor 7.

The stator 83 is tightly fixed in the motor casing 81. Windings 831 are winded on the stator 83. A PWM electric power, applied on the windings 831, generates a magnetic flux to interact with a magnetic field of the inner rotor 7. The inner rotor 7 generates torque and rotates to drive the type I impeller 5 to output hydraulic power. The type I containment shell 41 prevents the windings 831 of the stator 83 from being corroded by the corrosive fluid.

The pump side flange 811 of the motor casing 81 is used for tightly fixing with the shell flange part 411 and the pump casing 4 to prevent the leakage from the corrosive fluid. A back flange of the motor casing 81 is used for fixing the motor rear casing 82 to provide a complete structure supporting so that the monitoring shaft metal rear support 821b of the motor rear casing 82 may provide supporting needed by the stationary shaft 3.

The motor rear casing 82 is fixed with the motor casing 81 so that the monitoring shaft metal rear support 821b, on the motor rear casing 82, may provide supporting needed by the stationary shaft 3. An electric power wire of the windings 831 of the stator 83 is connected to a drive power via a lead port 822.

The inner rotor 7 is a ring-shaped structure comprising the main magnets 71, the rotor yoke 72, the secondary magnets 73 and the axially extended part 76. The number of the secondary magnets 73 is the same as the main magnets 71. The secondary magnets 73 are assembled at one end of the inner side of a rotor yoke 72 of the inner rotor 7 in the vicinity of the bottom side of the type I containment shell 41 as well as face oppositely away from the main magnets 71. A ceramic bearing 79 is installed in a central hole of the inner rotor 7. The hub plate 52 is used for combining with the axially extended part 76 of the inner rotor 7 so that the type I impeller 5 and the inner rotor 7 are integrated into one piece or embedded to be combined with each other into one piece.

When the pump operates, fluid flows along an inlet streamline 6 and is pressurized after flowing through the type I impeller 5, such as an impeller exit streamline 61. The pressurized fluid is output by an outlet 45 and a portion of the fluid, such as a turn back streamline 62, enters the inner space 415 of the type I containment shell 41 via a rear side of the type I impeller 5. After that, the fluid flows to the gap between an outer side of the inner rotor 7 and the inner space 415 of the type I containment shell 41, continuing through another gap between the stationary shaft 3 and the ceramic bearing 79. Then, the fluid flows through the hub aperture 54, such as an end lubrication streamline 65, to an inlet of the type I impeller 5. The circulating flowing of the fluid is used for providing the lubrication for the ceramic bearing 79 and taking away the heat generated by the inner rotor 7.

Please refer to FIG. 1E, which is a cross-sectional view of a double-sided-supported stationary shaft with a monitor device and a lengthened ceramic bearing of the canned pump according to the present invention. This embodiment discloses the canned pump with a lengthened ceramic bearing 79 for heavy duty operation. Therefore, in the structure design of the pump, the length of the rotor yoke 72 may be lengthened properly to meet with the length of the ceramic bearing 79.

Fourth Embodiment

The canned pump including a singled-sided-supported cantilever composited stationary shaft and a monitor device shown as in FIGS. 1D, 3B, 4B and 5B.

Figure 4A:
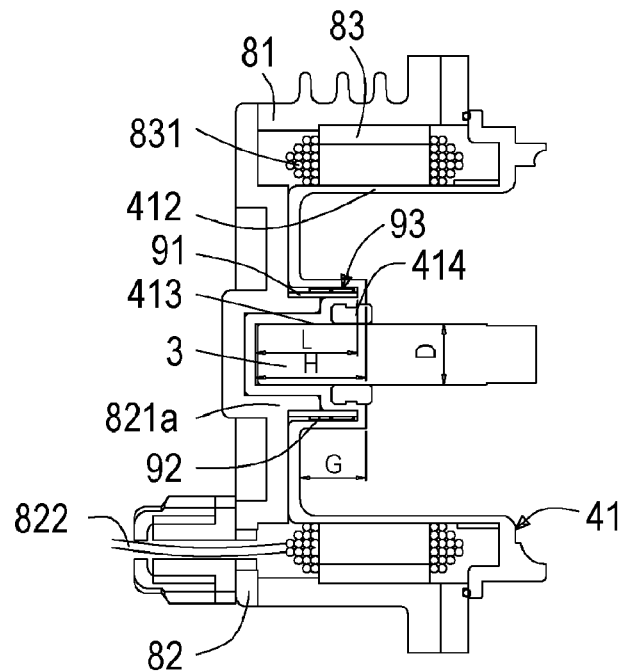
FIG. 4A shows an axial hold length L of a double-sided-supported stationary shaft according to the present invention.
Figure 4B:
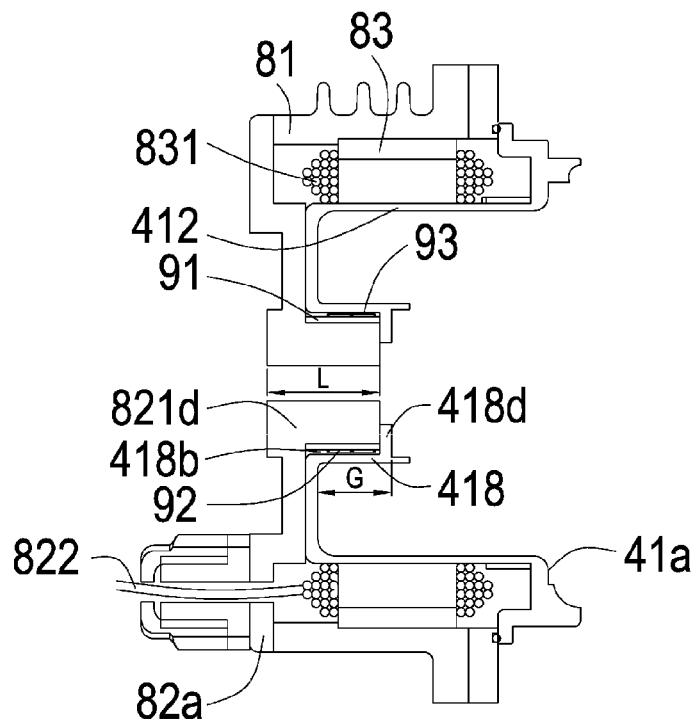
FIG. 4B shows an axial hold length L of a cantilever stationary shaft according to the present invention.

Reference to FIGS. 1D, 3B, 4B and 5B, FIG. 1D is a cross-sectional view of a single-sided-supported cantilever composited stationary shaft with a monitor device of the canned pump according to the present invention, FIG. 3B is a cross-sectional view of a containment shell of a cantilever stationary shaft of the canned pump according to the present invention, FIG. 4B shows an axial hold length L of a cantilever stationary shaft according to the present invention and FIG. 5B shows a inner rotor bearing multiple forces and moments thereof on a single-sided-supported cantilever stationary shaft according to the present invention. The canned pump comprises a metal casing 4a, a type II impeller 5a, a type II containment shell 41*a*, a monitor device 9, a composited stationary shaft 3*a* and a canned motor 8.

The metal casing 4*a* which includes an inlet 44, an outlet 45 and a flow channel 47 is used for containing the type II impeller 5*a*. The metal casing 4*a* is a metal wok structure by casting. A casing liner 4*b*, made of anti-corrosive plastic, is covered on an inner side of the metal casing 4*a*. A front thrust ring 46, installed at the inlet 44 in an inner side of the metal casing 4*a*, is used for mating with a front thrust bearing 53 of the type II impeller 5*a* to form a front axial thrust bearing.

The type II impeller 5*a* is installed in the metal casing 4*a*. A hub plate 52 is used for being combined with an axially extended part 76 of an inner rotor 7 so that the type II impeller 5*a* and the inner rotor 7 are integrated into one piece or embedded with each other into one piece. A hub balance hole 54*a* is a through hole at the center of a curve hub plate 55 for making circulating fluid re-circulate, for example, an end lubrication streamline 65. The inlet 44 of the metal casing 4*a* and the inlet of the type II impeller 5*a* form a smooth and increasing—inner-diameter channel without any disturbance, and the shape of the curve hub plate 55 is smooth curve shape as well. Therefore, it is favorable for reducing the flow speed of the fluid to make sure the pump has good NPSHr ability.

The type II containment shell 41*a* is a cup-shaped structure which has a rear shaft seat 418 including an aperture on a bottom side of the type II containment shell 41*a*. A shell flange part 411, on a front side of the type II containment shell 41*a*, is combined with the metal casing 4*a* and a pump side flange 811 of the canned motor 8, which prevents corrosive fluid from leakage. A shell column part 412 on a lateral side of the type II containment shell 41*a*, is passed through the inner side of the stator 83 with a loose slide fit. Also, the bottom side of the type II containment shell 41*a* is tightly attached to the motor rear casing 82*a* with sufficient supporting strength. The rear shaft seat 418, on the center on the bottom side of the type II containment shell 41*a*, extends inwardly towards the inner side of a rotor yoke 72. The rear shaft seat 418 further protrudes inwardly and includes an aperture 418*a* installed at an inner side of the rear shaft seat 418 and a concave aperture 418*b* installed on an outer side of the rear shaft seat 418 corresponding to each other. The aperture, installed on the center of the rear shaft seat 418, is used for containing the composited stationary shaft 3*a*.

A seal surface 418*d* of the rear shaft seat 418 is tightly attached by a surface of a ceramic shaft sleeve 33 including an O ring and a monitoring composited shaft metal rear support 821*d* of the motor rear casing 82*a* so that there is no leakage.

The monitor device 9, positioned on a ring-shaped surface of the concave aperture 418*b* of the rear shaft seat 418 which extends axially, is used for detecting the wear of the wear of the front thrust bearing 53 and the ceramic bearing 79. The structure of the monitor device 9 comprises multiple secondary magnets 73 and a monitor set 93. The number of the secondary magnets 73 is the same as the main magnets 71. The secondary magnets 73 are assembled at one end of the inner side of a rotor yoke 72 of the inner rotor 7 in the vicinity of the bottom side of the type II containment shell 41*a* as well as face oppositely away from the main magnets 71. The axial length of the secondary magnets 73 is at least more than twice as great as the length of an axial movement (including the axial wear of the front thrust bearing 53 and the ceramic bearing 79) of the inner rotor 7. The monitor set 93 comprises the secondary yoke 91 and multiple signal coil pairs 92 served as multiple monitor elements. The secondary yoke 91 take the position at the center of the secondary magnets 73 as a reference point, the axial length of the secondary yoke 91 is divided into two sections, a front section and a rear section. When the secondary magnets 73 are moved, two axial ends of the secondary magnets 73 do not exceed the ranges of the two sections of the secondary yoke 91.

The composited stationary shaft 3*a*, which is a cantilever supported structure, comprises a ceramic shaft sleeve 33, a metal shaft 32 and a motor rear casing 82*a*. The composited stationary shaft 3*a* and the type II containment shell 41*a* form a completely sealed shaft system. When an end of the composited stationary shaft 3*a* is installed on the monitoring composited shaft metal rear support 821*d* of the motor rear casing 82*a*, a required supporting strength is provided. The metal shaft 32 passes through a sleeve central hole 332 of the ceramic shaft sleeve 33 with the circular head 321 of the metal shaft 32 pressed tightly against the front end surface 333 of the ceramic shaft sleeve 33. The teeth part 323 of the metal shaft 32 passes through to the rear shaft seat 418 and a central hole of the monitoring composited shaft metal rear support 821*d* of the type 11 containment shell 41*a* which is extended inwardly in an axial direction. A nut of the teeth part 323 is fixed on the motor rear casing 82*a* so that a surface of a sliding thrust surface 331 of the ceramic shaft sleeve 33 is tightly pressed against a surface of the monitoring composited shaft metal rear support 821*d*. A circular head 321 of the metal shaft 32 is covered with a resin enclosure 322, and an O ring is installed on the circular head 321 which is used for sealing and corrosion resistance. The sliding thrust surface 331 of the ceramic shaft sleeve 33 is used for mating with the ceramic bearing 79 of the inner rotor 7 to form a rear axial thrust bearing. A surface of the sliding thrust surface 331 and a surface of the monitoring composited shaft metal rear support 821*d* of the motor rear casing 82*a* are tightly fixed and compressed with each other, and a seal surface 418*d* of the rear shaft seat 418 packed tightly between the sliding thrust surface 331 and the monitoring composited shaft metal rear support 821*d*, and press an O ring to make sure there is no leakage, thereby forming a composited stationary shaft 3*a* with high stiffness.

The canned motor 8 comprises the stator 83, a motor casing 81, the motor rear casing 82*a* and the inner rotor 7.

The stator 83 is tightly fixed in the motor casing 81. Windings 831 are winded on the stator 83. A PWM electric power, applied on the windings 831, may generate a magnetic flux to interact with a magnetic field of the inner rotor 7, so the inner rotor 7 generates torque and rotates to drive the type II impeller 5*a* to output hydraulic power. The type II containment shell 41*a* prevents the windings 831 of the stator 83 from being corroded by the corrosive fluid.

The pump side flange 811 which is fixed on a lateral pump side of the motor casing 81 and also fixing the shell flange part 411 and the metal casing 4*a* for preventing the corrosive fluid from leakage. A back flange of the motor casing 81 is used for fixing with the motor rear casing 82*a* to provide a complete structure supporting so that the monitoring composited shaft metal rear support 821*d* of the motor rear casing 82*a* may provide support which is required by the composited stationary shaft 3*a*.

The motor rear casing 82*a* is tightly fixed with the back flange of the motor casing 81 so that the monitoring composited shaft metal rear support 821*d* of the motor rear casing 82*a* may provide support which is required by the composited stationary shaft 3*a*. An electric power wire of the windings 831 of the stator 83 is connected to a drive power via a lead port 822.

The inner rotor 7 is a ring-shaped structure comprising the multiple main magnets 71, a rotor yoke 72, multiple secondary magnets 73 and the axially extended part 76. The number of the secondary magnets 73 is the same as the main magnets 71. The secondary magnets 73 are assembled at one end of the inner side of a rotor yoke 72 of the inner rotor 7 in the vicinity of the bottom side of the type I containment shell 41 as well as face oppositely away from the main magnets 71. The secondary magnets 73 is covered by a ring-shaped rotor resin enclosure 74 which is made of an engineering plastic with anti-corrosion property. A ceramic bearing 79 is installed in a central hole of the inner rotor 7. The hub plate 52 is used for combining with the axially extended part 76 of the inner rotor 7 so that the type II impeller 5a and the inner rotor 7 are integrated into one piece or embedded to be combined with each other into one piece.

When the pump operates, fluid flows along an inlet streamline 6 and is pressurized after flowing through the type II impeller 5a, such as an impeller exit streamline 61. The pressurized fluid is output by an outlet 45, and a portion of the fluid, such as a turn back streamline 62, enters the inner space 415 of the type II containment shell 41a via a rear side of the type II impeller 5a in the mean time. After that, the fluid flows to the gap between an outer side of the inner rotor 7 and the inner space 415 of the type II containment shell 41a, continuing through another gap between of the composited stationary shaft 3a and the ceramic bearing 79. Then, the fluid flows through a hub balance hole 54a which is at the center of the curve hub plate 55, such as an end lubrication streamline 65, to an inlet of the type II impeller 5a. The circulating flowing of the fluid is used for providing the lubrication for the ceramic bearing 79 and taking away the heat generated by the inner rotor 7.

Figure 2:
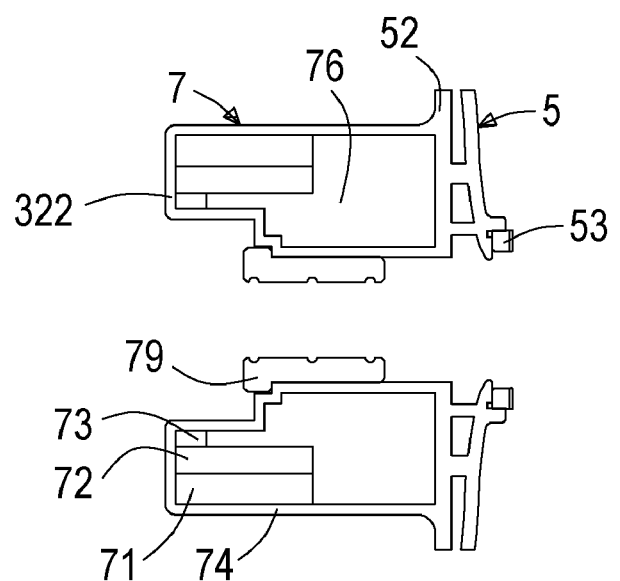
FIG. 2 is a cross-sectional view of an inner rotor of a motor and an impeller integrated into one unit according to the present invention.

Please refer to FIG. 2, which is a cross-sectional view of an inner rotor 7 of a motor and a type I impeller 5 integrated into one unit according to the third embodiment. The structure in this embodiment is also applicable to other embodiments in this invention. The ceramic bearing 79, installed in a hollow part of the inner rotor 7, is used for mating with the stationary shaft 3 to form a hydrodynamic bearing which is used for supporting the rotation of the inner rotor 7 and transmitting the motor power. The axially extended part 76 is used for being combined with the hub plate 52 to transmit the torque of the inner rotor 7. The secondary magnets 73 are assembled at one end of the inner side of a rotor yoke 72 of the inner rotor 7 as well as face oppositely away from the main magnets 71. The secondary magnets 73 and the inner rotor 7 are encapsulated together for preventing corrosion. The number of the secondary magnets 73 is the same as the main magnets 71 but the size of the secondary magnets 73 is less than one tenth of the main magnets 71.

Please refer to FIG. 3A, which is a cross-sectional view of a containment shell of a double-sided-supported stationary shaft of the canned pump according to the present invention. Take the type I containment shell 41 in the third embodiment for an example, the assembly of the ring slot 413b and the monitor set 93 are described as followed. The type I containment shell 41 is a cup-shaped structure without any through hole so that there is no leakage. The blank rear shaft support 413 at the center of the bottom side of the type I containment shell 41 extends inwardly. The axially extended length G is extended from the bottom side of the type I containment shell 41 towards the shell flange part 411. The blank rear shaft support 413 protrudes from the inner side and has the central shaft hold hole 413a whose depth H is from the opening of the blank rear shaft support 413 to the bottom side of the shaft hold hole 413a. The ring slot 413b is on the outer side of the type I containment shell 41. The rear thrust ring 414 is on the front surface of the shaft hold hole 413a. The monitor set 93, including the secondary yoke 91 and the signal coil pairs 92, may be positioned on the ring slot 413b which is on the outer side of the blank rear shaft support 413. The type I containment shell 41 is only used for providing anti-corrosion isolating ability without providing stiff supporting for the stationary shaft 3

Please refer to FIG. 3B, which is a cross-sectional view of a containment shell of a cantilever stationary shaft of the canned pump according to the present invention. Take the type II containment shell 41a of the fourth embodiment as an example. The assembly of the concave aperture 418b and the monitor set 93 are described as followed. The type II containment shell 41a is a cup-shaped shell structure comprising a hole which is on the center of the bottom side and is used for containing the composited stationary shaft 3a (shown in FIG. 1C). The rear shaft seat 418 on the center on the bottom side of the type II containment shell 41a, extends inwardly in the inner space. The rear shaft seat 418 is a convex structure having an aperture 418a and protruding from the inner side. The axially extended length G extends from the bottom side of the type II containment shell 41a towards the shell flange part 411 to the seal surface 418d. The outer side of the rear shaft seat 418 corresponds to the concave aperture 418b. The monitor set 93 positioned on an inner ring-shaped surface of the concave aperture 418b, includes the secondary yoke 91 and the multiple signal coil pairs 92. The secondary yoke 91 is tightly attached to the monitoring composited shaft metal rear support 821d. The composited stationary shaft 3a (shown in FIG. 1C) is installed in the aperture which is at the center of the rear shaft seat 418. The seal surface 418d of the rear shaft seat 418 is tightly pressed by the surface of the surface of the sliding thrust surface 331 of the ceramic shaft sleeve 33 (shown in FIG. 1C) including the O ring and the monitoring composited shaft metal rear support 821d of the motor rear casing 82a, which makes sure that there is no leakage from the type II containment shell 41a. The stiffness support of the composited stationary shaft 3a is completely comes from the motor rear casing 82a and the hold length L of the monitoring composited shaft metal rear support 821d.

Please refer to FIG. 4A, which shows an axial hold length L of a double-sided-supported stationary shaft according to the present invention. Take the double-sided supported stationary shaft 3 as an example. The axial hold length L is described as followed. The blank rear shaft support 413 is positioned at the center of the bottom side of the type I containment shell 41 and extends inwardly and axially to an inner space of the rotor yoke 72 (shown in FIG. 1A). The blank rear shaft support 413 includes the shaft hold hole 413a (shown in FIG. 3A) protruding inwardly and positioned in the blank rear shaft support 413, and the ring slot 413b (shown in FIG. 3A) positioned on the outer side of the blank rear shaft support 413. The monitor set 93, which includes the secondary yoke 91 and the signal coil pairs 92, is installed in the ring slot 413b (shown in FIG. 3A). The strength of the shaft hold hole 413a (shown in FIG. 3A), which is supported by the monitoring shaft metal rear support 821b of the motor rear casing 82 and the secondary yoke 91 tightly combined to each other, is provided by the outer sidewall of the haft hold hole 413a The bottom side of the shaft hold hole 413a is completely fitted with the inner side of the backward bulged part 823 of the motor rear casing 82. The length of the bulged part 823 is fitted with the hold length L of the shaft hold hole 413a for providing the high-stiff support. That is, the type I containment shell 41 is only used for providing anti-corrosion isolating ability without providing stiff support for the stationary shaft 3.

The hold length L is determined by the axially extended length G of the blank rear shaft support 413 and the hold hole depth H so that the axial stiff support may be practically provided. The longer the hold length L is, the much the problem of reduced plastic strength because of the rise of the temperature is solved.

Please refer to FIG. 4B, which shows an axial hold length L of a cantilever stationary shaft according to the present invention. Take the hold length L of the cantilever composited stationary shaft 3a (shown in FIG. 1C) as an example which is described as followed. The type II containment shell 41a which is the cup-shaped shell structure includes the rear shaft seat 418 positioned at the center of the bottom side, extending inwardly and axially in the inner space of the rotor yoke 72, and for containing the composited stationary shaft 3a (shown in FIG. 1C). The rear shaft seat 418 is a convex structure having an aperture 418a and protruding from the inner side and is a concave aperture 418b at the outer side. The monitor set 93 is installed on the inner ring-shaped surface of the concave aperture 418b. The seal surface 418d of the rear shaft seat 418 is tightly pressed by the surface of the surface of the sliding thrust surface 331 of the ceramic shaft sleeve 33 (shown in FIG. 1C) including the O ring and the monitoring composited shaft metal rear support 821d of the motor rear casing 82a

The longer the hold length L is, the greater the force and the moment can be borne. The composited stationary shaft 3a structure according to the invention may avoid the problem that the strength of the plastic material of the type II containment shell 41a may be reduced due to the rise of the temperature.

Please refer to FIG. 5A, which shows an inner rotor bearing multiple forces and moments thereof on a double-sided-supported stationary shaft according to the present invention. Take the inner rotor 7 which bears the multiple forces and moments thereof on the double-sided supported stationary shaft 3 according to the first and the third embodiments as an example which is described as followed. The stationary shaft 3 is made of anti-corrosion and anti-wear ceramic material. The front end of the stationary shaft 3 is supported by the plastic triangle front support 31, and the rear end of the stationary shaft 3 is supported and fixed by the blank rear shaft support 413 extending axially. The strength of the blank rear shaft support 413 is provided by the monitoring shaft metal rear support 821b and the secondary yoke 91 which are tightly combined with each other. The center portion of the stationary shaft 3 mates with the ceramic bearing 79, which is used for supporting the rotation of the inner rotor 7. The length of the center portion satisfies with the length of the ceramic bearing 79 and reserves the axial free-movement space of the inner rotor 7. Such as A, B, C in the figure, When the inner rotor 7 actually rotates, A rear axial free space A exists between the ceramic bearing 79 and the rear thrust ring 414, a front axial free space C exists between the ceramic bearing 79 and the triangle front support 31, and an axial gap B exists between the inner rotor 7 and the type I containment shell 41. The above-mentioned gaps(spaces) may be varied due to the wear of surfaces of the front thrust ring 46, the front thrust bearing 53, the rear thrust ring 414 and the ceramic bearing 79. In most cases, the inner rotor 7 is moved forward because of the axial thrust by the type I impeller 5 to make the front thrust ring 46 mate with the front thrust bearing 53 to slidably rotate. Thus, the axial width of the front axial free space C must be greater than the sum of the amount of wear allowance of the front thrust ring 46 and the front thrust bearing 53, and the width of the axial gap B is increased accordingly when the front axial free space C is reduced. However, when the pump rotates in the condition of high flow rate and low head, the inner rotor 7 may be moved backward because of the axial momentum of the fluid to make the rear thrust ring 414 mate with ceramic bearing 79 to slidably rotate and the width of the rear axial free space A is reduced to zero. Therefore, the width of the axial gap B must be greater than the total amount of the rear axial free space A, and the wear of the surface of the ceramic bearing 79 and the surface of the rear thrust ring 414, which prevents the inner rotor 7 from contacting the type I containment shell 41 directly, thereby resulting in the damage. In other words the axial free-movement distance of the inner rotor 7 is equaled to the sum of the rear axial free space A and the front axial free space C, and because the amount of size deformation of the plastic type I containment shell 41 and the pump casing 4 is usually big, the reserved gap size must include manufacturing tolerance. Under the above-mentioned operation conditions, the stationary shaft 3 and the supporting structure thereof must bear the multiple loading including an inner rotor weight W, an eccentric centrifugal force X, a radial force P and moments of these forces. The inner rotor weight W is the force generated by the weight of the inner rotor 7. The eccentric centrifugal force X is generated by the centroid of the inner rotor 7 resulted from the gaps of the ceramic bearing 79. The radial force P, generated from the uneven fluid pressure of the flow channel 47 of the pump casing 4, applies on the outlet surface of the type I impeller 5. The weight moment is equaled to the inner rotor weight W multiplied by a weight arm length WL. The centrifugal moment is equaled to the eccentric centrifugal force X multiplied by an eccentric length XL. The moment of radial force is equaled to the radial force P multiplied by a radial force arm length PL. Those forces and moments apply on the stationary shaft 3. The strength of the triangle front support 31 made of anti-corrosive plastic material is reduced when the temperature rises, and therefore most of the forces and the moments are borne by the supporting structure on the rear end of the stationary shaft 3. The eccentric centrifugal force X varying with the wearing of the ceramic bearing 79 is the most main variable loading applied on the stationary shaft 3. The greater the amount of the wear is, the greater the eccentric centrifugal force X is. The second main variable loading applied on the stationary shaft 3 is the radial force P from the uneven fluid pressure of the outlet surface of the impeller 5. The longest radial force arm length is from the outer diameter of the impeller 5 to the rear end of the stationary shaft 3, which causes the skew between the center of the inner rotor 7 and the axis of the stationary shaft 3, thereby making the supporting structure deformed continuously. Because the axially extended length G substantially reduces the length of the radial force arm length, and the hold length L increases the moment bearing ability of the stationary shaft 3. The above-mentioned skew and structure deformation problem may be alleviated and improved, and therefore, the requirement for the strength of the supporting structure of the triangle front support 31 positioned at the front end of the stationary shaft 3 may be greatly reduced.

Please refer to FIG. 5B, which is an inner rotor bearing multiple forces and moments thereof on a single-sided-supported cantilever stationary shaft according to the present invention. Take the inner rotor 7 bearing the multiple forces and moments thereof on the single-sided supported composited stationary shaft 3a according to the second and the fourth embodiments as an example which is described as followed. The composited stationary shaft 3a is made of the metal shaft 32 and the ceramic shaft sleeve 33. When the end of the composited stationary shaft 3a is installed on the monitoring composited shaft metal rear support 821d of the motor rear casing 82, the needed supporting strength may be obtained. The metal shaft 32 passes through the sleeve central hole 332 of the ceramic shaft sleeve 33, and the end of the circular head 321 is tightly pressed against the front end surface 333 of the ceramic shaft sleeve 33. The teeth part 323 of the metal shaft 32 passes through the rear shaft seat 418 of the type II containment shell 41a and the central hole of the monitoring composited shaft metal rear support 821d, and is fixed with the motor rear casing 82 by the metal shaft 32. The surface of the sliding thrust surface 331 of the ceramic shaft sleeve 33 may be tightly pressed against the surface of the monitoring composited shaft metal rear support 821d so that the composited stationary shaft 3a with high stiffness is formed. The composited stationary shaft 3a, whose length satisfies the length requirement for the ceramic bearing 79, mates with ceramic bearing 79 for supporting the rotation of the inner rotor 7, and reserves the axial free-movement space of the inner rotor 7, such as A, B. When the inner rotor 7 actually operates, a rear axial free space A exists between the ceramic bearing 79 and the rear thrust ring 414, an axial gap B exists between the inner rotor 7 and the type II containment shell 41a. The two above-mentioned gaps are varied because of the wearing of the front thrust ring 46, the front thrust bearing 53, the rear thrust ring 414 and the ceramic bearing 79. Under most conditions, the inner rotor 7 is moved forward by the axial thrust of the type II impeller 5a so that the front thrust ring 46 mates with the front thrust bearing 53 to slidably rotate. The width of the axial gap B is increased accordingly. When the pump operates in the condition of high flow rate and low head, the inner rotor 7 is moved backward because of the axial momentum of the fluid, which makes the rear thrust ring 414 mate with the ceramic bearing 79 to slidably rotate and the width of the rear axial free space A is reduced to zero. Therefore, the width of the axial gap B must be greater than the sum of the rear axial free space A and the amount of wear of the surface of the ceramic bearing 79 and the rear thrust ring 414, which prevents the inner rotor 7 from directly contacting the type H containment shell 41a, thereby causing the damage. In other words, the rear axial free space A is varied according to the axial free-movement of the inner rotor 7, because the amount of size deformation of the plastic type H containment shell 41a is usually big, each of the reserved gap sizes must include manufacturing tolerance. Under the above-mentioned operation conditions, the composited stationary shaft 3a and the supporting structure thereof must bear the multiple loading including an inner rotor weight W, an eccentric centrifugal force X, a radial force P and moments of these forces. The inner rotor weight W is the force generated by the weight of the inner rotor 7. The eccentric centrifugal force X is generated by the centroid of the inner rotor 7 resulted from the gaps of the ceramic bearing 79. The radial force P, generated from the uneven fluid pressure of the flow channel 47 of the metal casing 4a, applies on the outlet surface of the type II impeller 5a. The weight moment is equaled to the inner rotor weight W multiplied by a weight arm length WL. The centrifugal moment is equaled to the eccentric centrifugal force X multiplied by an eccentric length XL. The moment of the radial force is equaled to the radial force P multiplied by a radial force arm length PL. Those forces and moments apply on the composited stationary shaft 3a, and are borne by the metal composited support. The eccentric centrifugal force X varying with the wearing of the ceramic bearing 79 is the most main variable loading applied on the composited stationary shaft 3a. The greater the amount of the wear is, the greater the eccentric centrifugal force X is. The second main variable loading applied on the composited stationary shaft 3a is the radial force P from the uneven fluid pressure of the outlet surface of the impeller 5. The longest radial force arm length is from the outer diameter of the impeller 5 to the rear end of the composited stationary shaft 3a, which causes the skew between the center of the inner rotor 7 and the axis of the composited stationary shaft 3a, thereby making the supporting structure deformed continuously. Because the axially extended length G substantially reduces the length of the radial force arm length and the hold length L increases the moment bearing ability of the composited stationary shaft 3a, the above-mentioned skew and structure deformation problem may be alleviated and improved.

The Fifth Embodiment

A monitor device of the canned pump for detecting the wear of a bearing, FIGS. 6A, 6B, 6C, 6D.

Figure 6A:
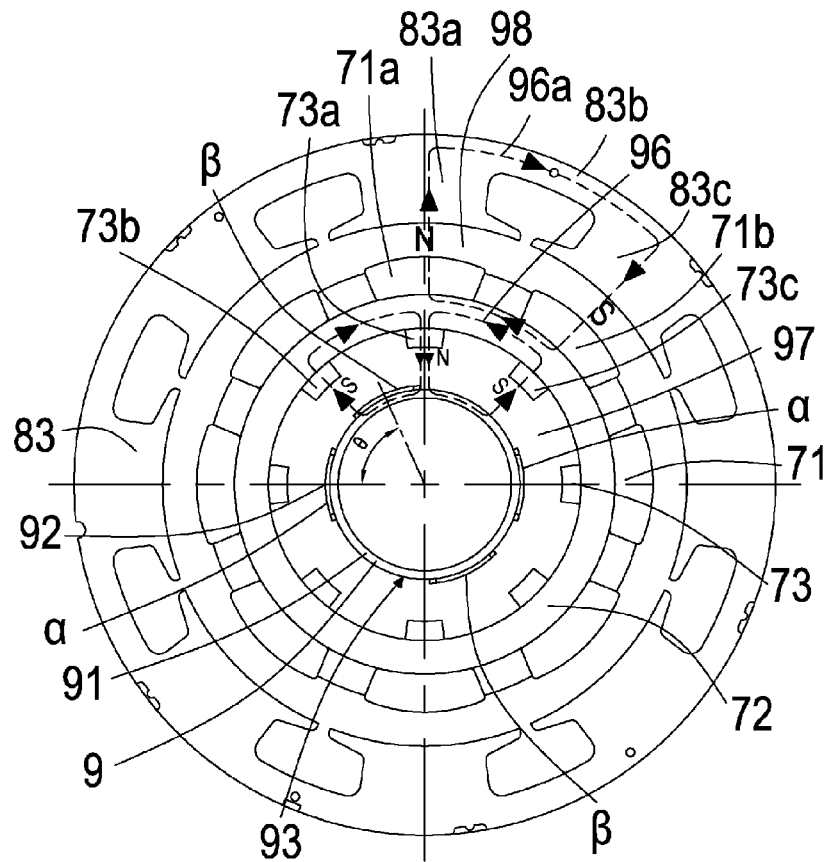
FIG. 6A is a radial cross-sectional view of a monitor device for detecting the wear of the front thrust bearing and the ceramic bearing of a motor according to the present invention.

Please refer to FIG. 6A, which is a radial cross-sectional view of a monitor device for detecting the wear of a front thrust bearing and the ceramic bearing of a motor according to the present invention. The figure takes an eight-poles-and-eight-coils design for an example, but is not limited to the invention. Other designs or methods may achieve the same effect according other embodiments.

A monitor device 9 comprises multiple secondary magnets 73 and a monitor set 93. The secondary magnets 73 are assembled at one end of the inner side of a rotor yoke 72 of the inner rotor 7 in the vicinity of the bottom side of the type I containment shell 41 as well as face oppositely away from the main magnets 71. The number of the secondary magnets 73 is the same as the main magnets 71 but the size of the secondary magnets 73 is less than one tenth of the main magnets 71, and the area and the thickness of the secondary magnets 73 at least provide the magnetomotive force (MMF) and the magnetic flux which are needed by the signal coil pairs. Here, the circumference of the inner rotor 7 is divided into eight pieces according to the number of the secondary magnets 73 and each of them has an electric included angle of 180 degrees and a space included angle of 45 degrees. The main magnetic flux lines emits from a surface of a forward flux magnet 71a and passes through a motor magnetic gap 98 to a stator teeth 83a of a stator 83, continues to the adjacent stator teeth 83c via a stator yoke 83b, and passes through the motor magnetic gap 98 again, then to a original adjacent backward flux magnet 71b, and returns back to the original forward flux magnet 71a via the rotor yoke 72 so that the stator yoke magnetic route 96a is formed (hereafter called main magnetic loop) The secondary magnetic flux lines emit from a surface of the forward flux secondary magnet 73a to the secondary yoke 91 through the monitoring magnetic gap 97, and via a secondary yoke 92 pass through the monitoring magnetic gap 97 again, and back to an original adjacent backward flux secondary magnet 73b and another backward flux secondary magnet 73c, respectively, and return back to the original secondary magnets 73a through the rotor yoke 72 so that the rotor yoke magnetic route 96 is formed (hereafter called secondary magnetic loop), and the secondary magnetic loop passes through the monitor device Therefore, the main magnetic loop and the secondary magnetic loop coexist in the rotor yoke 72. That is, the magnetic flux lines of the monitor device 9 pass through the rotor yoke 72 without being disturbed. When the inner rotor 7 rotates, the monitor device 9 outputs an electromotive force signal (i.e. a voltage signal) by cutting the secondary magnetic flux lines so the voltage signal is independent and the interference of an outer voltage is avoided. The monitor set 93 comprises the secondary yoke 91 and the multiple signal coil pairs 92. The multiple signal coil pairs 92, served as multiple monitor elements and installed on a surface of the secondary yoke 91, comprises front signal coil pairs 92a and rear coil pairs 92b which are axially and tightly arranged side by side and are aligned with a secondary magnet center 73g (shown in FIG. 6C). Moreover, the signal coil pairs 92 are divided into two groups of coils, signal coils α and signal coils β, along a circumferential direction. Each of the groups has two signal coil pairs, which are corresponding to each other in a radial direction of 180 degrees. Eight signal coils, which include a signal coil $\alpha_{11}$, a signal coil $\alpha_{12}$, a signal coil $\alpha_{21}$, a signal coil $\alpha_{22}$, a signal coil $\beta_{11}$, a signal coil $\beta_{12}$, a signal coil $\beta_{21}$, a signal coil $\beta_{22}$, have the same size, and the difference between the electric included angle of the signal coils α and the signal coils β is 90 degrees (or 270 degrees) and the difference between the space included angle Θ of the signal coils α and the signal coils β is 112.5 degrees (or 67.5 degrees). The front signal coil pairs 92a comprise a signal coil α11, a signal coil $\alpha_{21}$, a signal coil $\beta_{11}$ and a signal coil $\beta_{21}$. The rear signal coil pairs 92b comprise a signal coil $\alpha_{12}$, a signal coil $\alpha_{22}$, a signal coil $\beta_{12}$ and a signal coil $\beta_{22}$. The positioning of the electric included angles and the space included angles of the above-mentioned signal coil pairs 92 are obtained by a magnet alignment point 911 (shown in FIG. 6C) of a secondary yoke rear end 91b of the secondary yoke 91. The magnet alignment point 911 aligns with the center of the signal coils $\alpha_{11}$, and when the electric included angle of the magnet alignment point 911 is 90 degrees and the space included angle of the magnet alignment point 911 is 22.5 degrees, it is favorable for repairing and exchanging the monitor set 93. The length of the ring-shape secondary yoke 91 of the independent monitor device 9 is longer than the sum of the axial length of the rotor yoke 72 and the axial movement length of the inner rotor 7, and is longer than the total axial length of the signal coil pairs 92 (including the limit value of the wear of the front thrust bearing and the ceramic bearing). The width of the circumference of the signal coil pairs 92 is not greater than the electric included angle of 180 degrees. The secondary yoke front end 91a and the secondary yoke rear end 91b completely cover the signal coil pairs 92, which makes sure that when the inner rotor 7 is moved axially, the magnetic flux lines of the rotor yoke magnetic route 96 of the secondary magnets still can be stable as well as prevent the deformation and the bending, thereby ensuring the stability and the linearity of the voltage signal of the signal coil pairs 92. When the inner rotor 7 is moved both in a radial and an axial direction, the differential voltage signals of the signal coil pairs 92 are obtained. The differential voltage signals of different combinations of the signal coil pairs may represent an axial movement or a radial movement. When the amount of movement exceeds the axial free space or a gap of the ceramic bearing 79, it shows that the wear of the front thrust bearing 53 and the ceramic bearing 79 happens and the amount of the wears can be calculated. When the movement exceeds a wear warning value, a warning notice must be transmitted, and when the movement exceeds a wear limit value, the operation of the pump must be stopped.

Figure 6B:
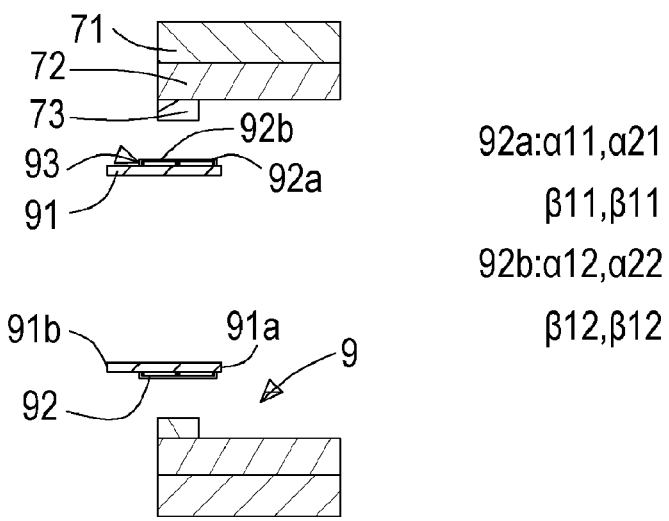
FIG. 6B is an axial cross-sectional view of a monitor device for detecting the wear of the front thrust bearing and the ceramic bearing according to the present invention.
Figure 6C:
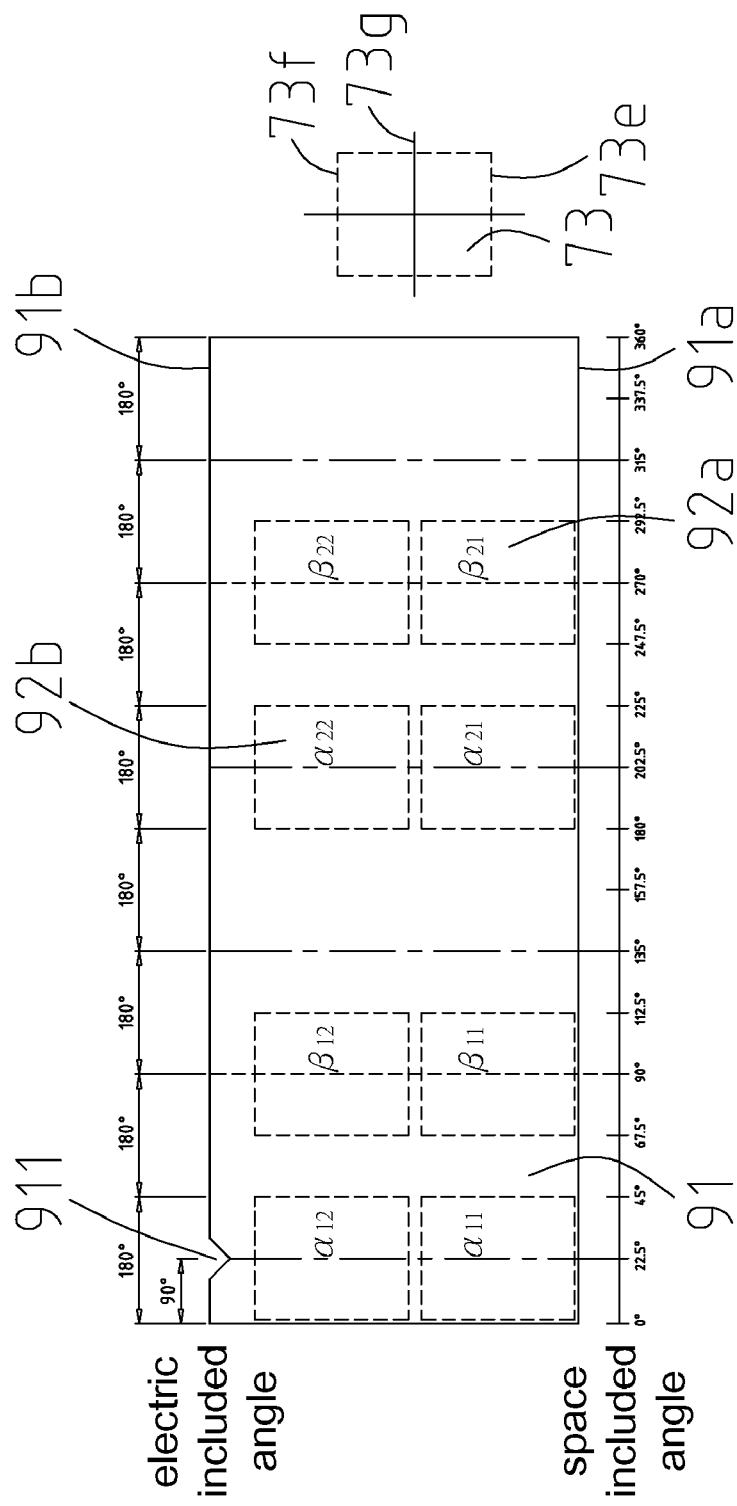
FIG. 6C is a schematic view of a monitor device for detecting the wear of the front thrust bearing and the ceramic bearing utilizing eight signal coil pairs according to the present invention.
Figure 6D:
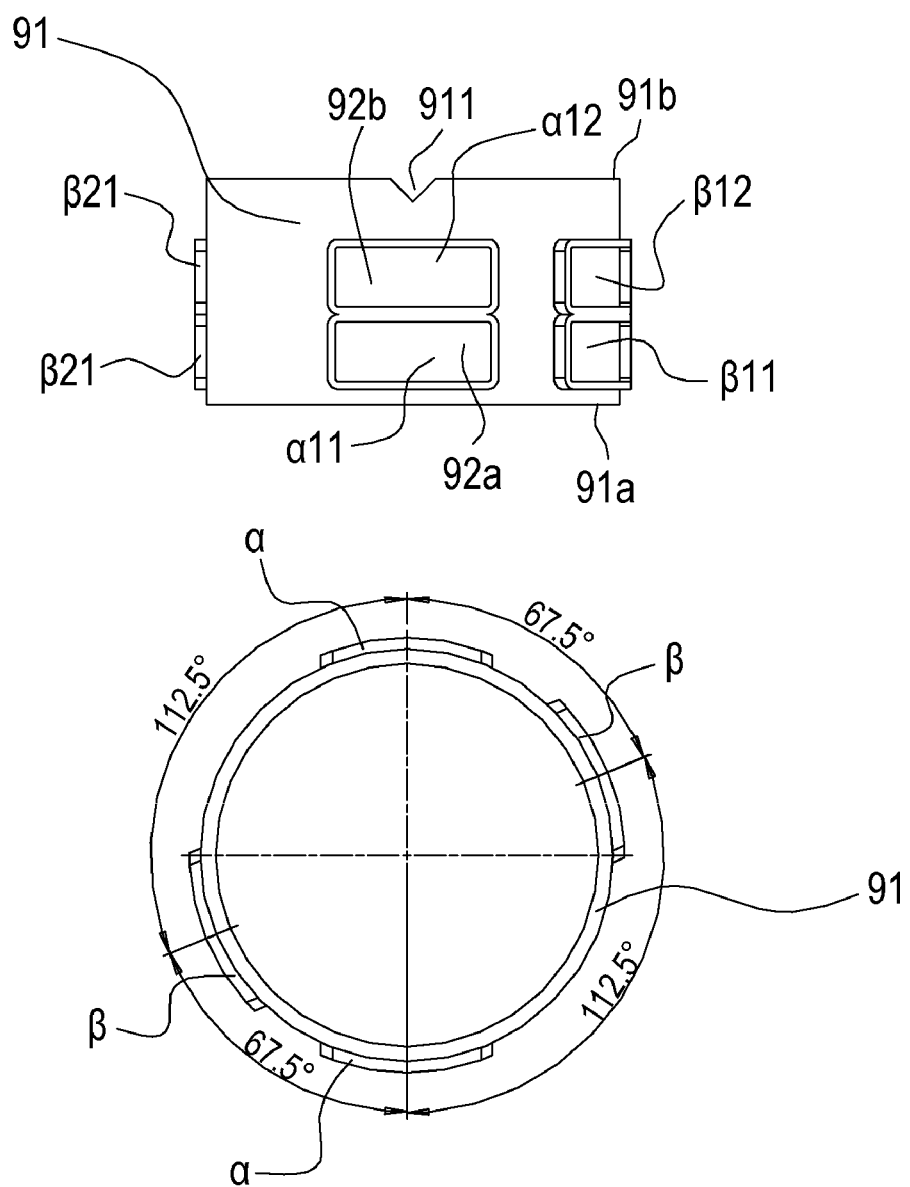
FIG. 6D is a schematic perspective view of a monitor device for detecting the wear of the front thrust bearing and the ceramic bearing according to the present invention.

Please refer to FIGS. 6B, 6C and 6D. FIG. 6B is an axial cross-sectional view of a monitor device for detecting the wear of the front thrust bearing and the ceramic bearing according to the present invention; FIG. 6C is a schematic view of a monitor device for detecting the wear of the front thrust bearing and the ceramic bearing utilizing eight signal coil pairs according to the present invention; and FIG. 6D is a schematic perspective view of a monitor device for detecting the wear of the front thrust bearing and the ceramic bearing according to the present invention. The figures show an actual way of arranging signal coil pairs of a monitor device for detecting the wear of the front thrust bearing and the ceramic bearing and a method for calculating the voltage signals. The figures take an eight-poles-and-eight-coils design for an example, but not limited to the invention. Other designs and calculating methods may achieve the same effect according other embodiments. The monitor device 9 comprises eight signal coil pairs 92, which include a signal coil $\alpha_{11}$, a signal coil $\alpha_{12}$, a signal coil $\alpha_{21}$, a signal coil $\alpha_{22}$, a signal coil $\alpha_{11}$, a signal coil $\beta_{12}$, a signal coil $\beta_{21}$, a signal coil $\beta_{22}$. When the inner rotor 7 rotates, a rotating magnetic field is formed between the secondary magnets 73 and the signal coil pairs 92 and the voltage signals is outputted, and this voltage signals can be calculated by a d-q axis transform method and is converted into an axial and a radial movements of the inner rotor 7 which can be the criterion of the wear of the front thrust bearing and the ceramic bearing. The corresponding specification is described hereinafter:

Signals of the eight signal coil pairs of the monitor device 9 take an average value as the signal values, which are:

$$e_{\alpha T} = \frac{1}{4}(e_{\alpha 11} + e_{\alpha 12} + e_{\alpha 21} + e_{\alpha 22}) \tag{1a}$$

$$e_{\beta T} = \frac{1}{4}(e_{\beta 11} + e_{\beta 12} + e_{\beta 21} + e_{\beta 22}) \tag{1b}$$

Because the above-mentioned average value signals are not affected by the axial wear and the radial wear of the front thrust bearing and the ceramic bearing; and the electric included angle difference between the signals of $e_{\alpha T}$ and $e_{\beta T}$ is 90 degrees. Suppose the equations of $e_{\alpha T}$ and $e_{\beta T}$ are:

$$e_{\alpha T} = \lambda'_{mT} \omega_r \cos \theta_{r\text{-}f} \tag{2}$$

$$e_{\beta T} = \lambda'_{mT} \omega_r \cos \theta_{r\text{-}f} \tag{3}$$

In the above-mentioned equations, $\omega_r$ is the rotation speed, $\lambda_{mT}$ is a flux linkage between the secondary magnets 73 and the signal coil pairs 92, $\theta_{r\text{-}f}$ is the relative angular positions of the secondary magnets between α and β signal coils of the monitor device 9. $\omega_r$ and $\theta_{r\text{-}f}$ from the above-mentioned equations (2) and (3) can be calculated as:

$$\hat{\omega}_r = \frac{1}{\lambda'_{mT}} \sqrt{e_{\alpha T}^2 + e_{\beta T}^2} \tag{4}$$

$$\hat{\theta}_{r\text{-}f} = \tan^{-1} \frac{e_{\beta T}}{e_{\alpha T}} \tag{5}$$

wherein $\lambda'_{mT}$ can be obtained by measuring. The mechanical rotation speed and the relative mechanical angular position can be obtained by the following equations:

$$\hat{\omega}_m = \frac{2}{N_p}\hat{\omega}_r, \tag{6a}$$

$N_p$ is number of poles, in this embodiment, $N_p = 8$ $$\hat{\theta}_m = \frac{2}{N_p}\hat{\theta}_{r-f} \tag{6b}$$

In order to calculate the axial wear and the radial wear of the front thrust bearing and the ceramic bearing, each signal of the signal coil pairs 92 is put into transformation matrixes to convert signals into d-q axes coordinates, shown as followed:

$$e_{\alpha\beta11} = [e_{\alpha11} e_{\beta11}]^T \tag{7a}$$

$$e_{\alpha\beta12} = [e_{\alpha12} e_{\beta12}]^T \tag{7b}$$

$$e_{\alpha\beta21} = [e_{\alpha21} e_{\beta21}]^T \tag{7c}$$

$$e_{\alpha\beta22} = [e_{\alpha22} e_{\beta22}]^T \tag{7d}$$

$$T_\theta(\hat{\theta}_{r-f}) = \begin{bmatrix} \cos\hat{\theta}_{r-f} & -\sin\hat{\theta}_{r-f} \\ \sin\hat{\theta}_{r-f} & \cos\hat{\theta}_{r-f} \end{bmatrix} \tag{8}$$

$$e_{qd11} = T_\Theta(\hat{\Theta}_{r-f}) e_{\alpha\beta11} \tag{9a}$$

$$e_{qd12} = T_\Theta(\hat{\Theta}_{r-f}) e_{\alpha\beta12} \tag{9b}$$

$$e_{qd21} = T_\Theta(\hat{\Theta}_{r-f}) e_{\alpha\beta21} \tag{9c}$$

$$e_{qd22} = T_\Theta(\hat{\Theta}_{r-f}) e_{\alpha\beta22} \tag{9d}$$

The greater of the following two difference values is taken as the criteria of the axial movement and the wear of the front thrust bearing and the ceramic bearing:

$$\varepsilon_{a11} = e_{qd11} - e_{qd12} \tag{10a}$$

$$\varepsilon_{a21} = e_{qd21} - e_{qd22} \tag{10b}$$

The greater of the following two difference values is taken as the criteria of the radial movement and the wear of the front thrust bearing and the ceramic bearing:

$$\varepsilon_{r11} = e_{qd11} - e_{qd21} \tag{11a}$$

$$\varepsilon_{r21} = e_{qd12} - e_{qd22} \tag{11b}$$

The greater of the following two difference values is taken as the total criteria of the radial movement, the axial movement and the wear of the front thrust bearing and the ceramic bearing:

$$\varepsilon_{m11} = e_{qd11} - e_{qd22} \tag{12a}$$

$$\varepsilon_{m12} = e_{qd12} - e_{qd21} \tag{12b}$$

The value of the eccentric movement and the angular position of the inner rotor 7, that is, the actual movement track of the inertial center of the inner rotor, can be calculated according to the above-mentioned equations.

The Sixth Embodiment

Figure 6E:
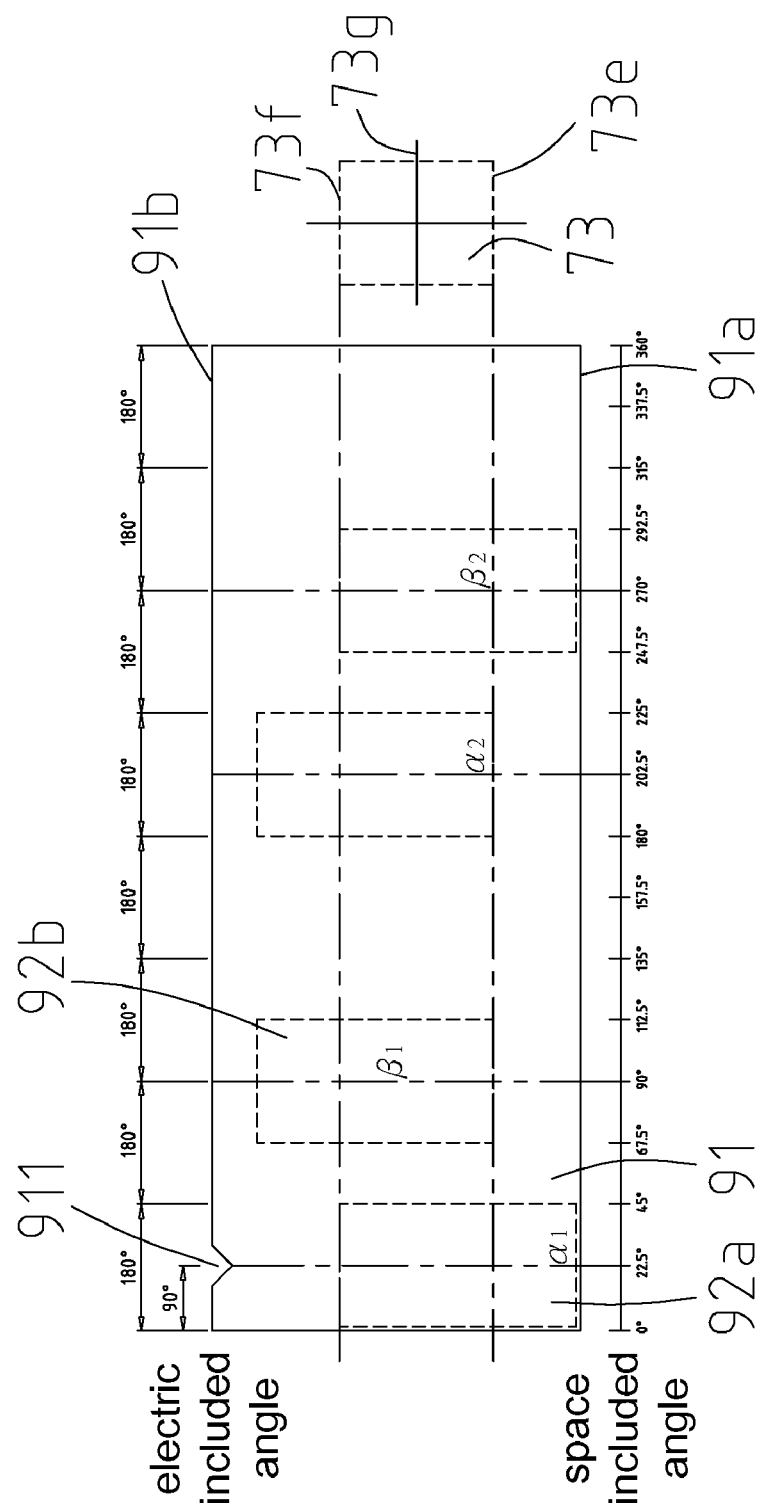
FIG. 6E is a schematic view of a monitor device for detecting the wear of the front thrust bearing and the ceramic bearing utilizing four signal coil pairs according to the present invention.

A monitor device for detecting the wear of the front thrust bearing and the ceramic bearing of the canned pump, FIG. 6E.

Please refer to FIG. 6E, which is a schematic view of a monitor device for detecting the wear of the front thrust bearing and the ceramic bearing utilizing two pairs of signal coils according to the present invention. Compared to the fifth embodiment, the number of signal coil pairs 92 of monitor device 9 for detecting the wear of the front thrust bearing 53 and the ceramic bearing 79 is reduced to four according to this embodiment. The figure takes an eight-poles-and-four-coils design for an example, but is not limited to the invention. Other designs or methods may achieve the same effect according other embodiments. The area and the thickness of secondary magnets 73 at least provide the magnetomotive force (MMF) and the magnetic flux which are needed by the signal coil pairs. A monitor set 93 comprises a secondary yoke 91 and the multiple signal coil pairs 92. Here, the circumference of an inner rotor 7 is divided into eight pieces according to the number of the secondary magnets 73 and each of them has an electric included angle of 180 degrees and a space included angle of 45 degrees. The signal coil pairs 92 are divided into two groups including signal coils α and signal coils β. The signal coils α comprise a signal coil $\alpha_1$ and a signal coil $\alpha_2$, and the signal coils β comprise a signal coil $\beta_1$ and a signal coil $\beta_2$. The differences of electric included angle and the space included angle between the signal coils α and β are 90 degrees (or 270 degrees) and 112.5 degrees (or 67.5 degrees), respectively. Each of the groups has two signal coil pairs, which are corresponding to each other in a radial direction of 180 degrees. The signal coils $\alpha_1$, $\alpha_2$, $\beta_1$ and $\beta_2$ have the same size and the axial length of each of the coils $\alpha_1$, $\alpha_2$, $\beta_1$ and $\beta_2$ is not less than the sum of the length of the secondary magnets 73 and the length of the axial free-movement of the inner rotor 7 (including the limit value of the wear of the front thrust bearing 53 and the ceramic bearing 79), and the width of the circumference of each signal coils is not greater than the electric included angle of 180 degrees. Front ends of each of the signal coils $\alpha_1$ and $\beta_2$ align with a secondary yoke front end 91a of the secondary yoke 91. Rear ends of each of the signal coils $\alpha_1$ and $\beta_2$ align with a secondary magnet rear end 73f of the secondary magnets 73. Front ends of each of the signal coils $\alpha_2$ and $\beta_1$ align with a secondary magnet front end 73e of the secondary magnets 73. Rear ends of each of the signal coils $\alpha_2$ and $\beta_1$ align with a secondary yoke rear end 91b of the secondary yoke 91. In other words, the signal coils $\alpha_1$, $\alpha_2$, $\beta_1$ and $\beta_2$ are axially arranged in a stagger way and axially aligned with the front and the rear ends of the secondary magnets 73. The positions of the electric angle and the space angle of the above-mentioned signal coil pairs 92 are obtained by a magnet alignment point 911 which is positioned on the secondary yoke rear end 91b of the secondary yoke 91 and corresponds to the center of the signal coils $\alpha_1$. The electric angle and the space angle of the magnet alignment point 911 are 90 degrees and 22.5 degrees, respectively so that it is favorable for repairing and exchanging the monitor set 93 conveniently. The axial length of the secondary yoke 91 is greater than the total axial length of the arranged signal coil pairs 92, the signal coil pairs 92 completely located between the secondary yoke front end 91a and the secondary yoke rear end 91b for ensuring that when the inner rotor 7 is moved axially, the magnetic flux lines of the secondary magnetic loop of the secondary magnets 73 may be stable without deformation or bending, maintaining itself to be distributed on the surface of the secondary yoke 91 stably, thereby ensuring the stability and linearity of a voltage signal of the signal coil pairs 92. The axial movement and the radial movement of the inner rotor 7 can be calculated from the difference value of these voltage signals of the signal coil pairs 92. When the amount of movement exceeds the axial free space or a gap of the ceramic bearing 79, it shows that the wear of the front thrust bearing 53 and the ceramic bearing 79 happens and the amount of the wears can be calculated. When the movement exceeds a wear warning value, a warning notice must be transmitted, and when the movement exceeds a wear limit value, the operation of the pump must be stopped.

Signals of the four signal coils of the monitor device 9 take an average value as the signal values, which are:

$$e_{\alpha T} = \frac{1}{2}(e_{\alpha 1} + e_{\alpha 2}) \quad (13a)$$

$$e_{\beta T} = \frac{1}{2}(e_{\beta 1} + e_{\beta 2}) \quad (13b)$$

Because the above-mentioned average value signals are not affected by the axial wear and the radial wear of the front thrust bearing 53 and the ceramic bearing 79; and the electric included angle difference between the signals of $e_{\alpha T}$ and $e_{\beta T}$ is 90 degrees. Suppose the equations of and $e_{\beta T}$ are:

$$e_{\alpha T} = \lambda'_{mT} \omega_r \cos \theta_{r-f} \quad (14)$$

$$e_{\beta T} = \lambda'_{mT} \omega_r \cos \theta_{r-f} \quad (15)$$

In the above-mentioned equations, $\omega_r$ is the rotation speed, $\lambda_{mT}$ is a flux linkage between the secondary magnets 73 and the signal coil pairs 92, $\theta_{r-f}$ is the relative angular positions of the secondary magnets between $\alpha$ and $\beta$ signal coils of the monitor device 9. $\omega_r$ and $e_{r-f}$ from the above-mentioned equations (14) and (15) can be calculated as:

$$\hat{\omega}_r = \frac{1}{\lambda'_{mT}}\sqrt{e_{\alpha T}^2 + e_{\beta T}^2} \quad (16)$$

$$\hat{\theta}_{r-f} = \tan^{-1}\frac{e_{\beta T}}{e_{\alpha T}} \quad (17)$$

wherein $\lambda'_{mT}$ can be obtained by measuring. The mechanical rotation speed and the relative mechanical angular position can be obtained by the following equations:

$$\hat{\omega}_m = \frac{2}{N_p}\hat{\omega}_r, \quad (18a)$$

$N_p$ is number of poles, in this embodiment,
$N_p = 8$ $$\theta_m = \frac{2}{N_p}\theta_{r-f} \quad (18b)$$

In order to calculate the axial wear and the radial wear of the wear of the front thrust bearing 53 and the ceramic bearing 79, each signal of the signal coil pairs 92 is put into transformation matrixes to convert signals into d-q axes coordinates, shown as followed:

$$e_{a12} = [e_{\alpha 1} e_{\beta 2}]^T \quad (19a)$$

$$e_{a21} = [e_{\alpha 2} e_{\beta 1}]^T \quad (19b)$$

$$e_{r11} = [e_{\alpha 1} e_{\beta 2}]^T \quad (19c)$$

$$e_{r12} = [e_{\alpha 2} e_{\beta 2}]^T \quad (19d)$$

$$T_{\theta}(\hat{\theta}_{r-f}) = \begin{bmatrix} \cos\hat{\theta}_{r-f} & -\sin\hat{\theta}_{r-f} \\ \sin\hat{\theta}_{r-f} & \cos\hat{\theta}_{r-f} \end{bmatrix} \quad (20)$$

$$e_{qd12} = T_{\Theta}(\hat{\Theta}_{r-f})e_{a12} \quad (21a)$$

$$e_{qd21} = T_{\Theta}(\hat{\Theta}_{r-f})e_{a21} \quad (22b)$$

$$e_{qd11} = T_{\Theta}(\hat{\Theta}_{r-f})e_{a11} \quad (23a)$$

$$e_{qd22} = T_{\Theta}(\hat{\Theta}_{r-f})e_{a22} \quad (24b)$$

The following difference value is taken as the criteria of the axial movement and the wear of the front thrust bearing 53 and the ceramic bearing 79:

$$\varepsilon_a = e_{qd12} - e_{qd21} \quad (25)$$

The following difference value is taken as the criteria of the radial movement and the wear of the ceramic bearing 79:

$$\varepsilon_r = e_{qd11} - e_{qd22} \quad (26)$$

The total criteria of the radial movement, the axial movement and the wear of the front thrust bearing 53 and the ceramic bearing 79 may consider $\varepsilon_a$ and $\varepsilon_r$.

The value of the eccentric movement and the angular position of the inner rotor 7, that is, the actual movement track of the inertial center of the inner rotor, can be calculated according to the above-mentioned equations.

The Seventh Embodiment

Figure 7:
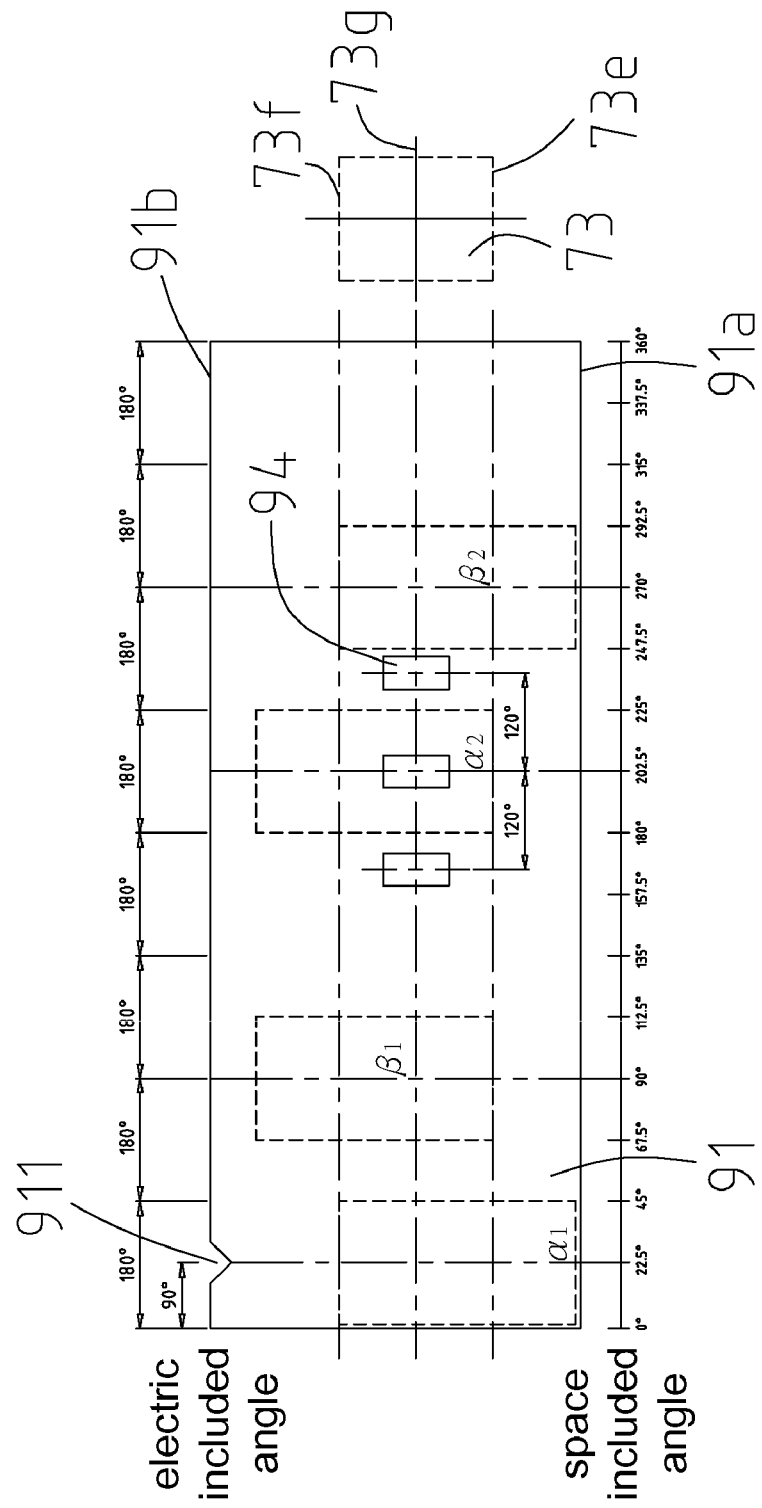
FIG. 7 is a schematic view of a monitor device of the canned pump including three hall sensors according to the present invention.

The canned pump including a hall sensor, FIG. 7.

Please refer to FIG. 7, which is a schematic view of a monitor device of the canned pump including a hall sensor according to the present invention. The figure takes a composited monitor device 9 including three hall sensors 94 with eight poles and four signal coils as an example, but is not limited to the invention. Other designs may achieve the same effect. The signal coils are divided into two groups which are signal coils $\alpha$ and signal coils $\beta$. The signal coils $\alpha$ comprises a signal coil $\alpha_1$ and a signal coil $\alpha_2$, and the signal coils $\beta$ comprises a signal coil $\beta_1$ and a signal coil $\beta_2$. The electric included angle between $\alpha$ and $\beta$ signal coils is 90 degrees (270 degrees) and the space included angle $\Theta$ between $\alpha$ and $\beta$ signal coils is 112.5 degrees (67.5 degrees). The signal coils $\alpha_1$, $\alpha_2$, $\beta_1$ and $\beta_2$ have the same size and the axial length of each of the coils $\alpha_1$, $\alpha_2$, $\beta_1$ and $\beta_2$ is not less than the sum of the length of the secondary magnets 73 and the length of the axial free-movement of the inner rotor 7 (including the limit value of the wear of the front thrust bearing 53 and the ceramic bearing 79), and the width of the circumference of each signal coils is not greater than the electric included angle of 180 degrees. Front ends of each of the signal coils $\alpha_1$ and $\beta_2$ align with a secondary yoke front end 91a of the secondary yoke 91. Front ends of each of the signal coils $\alpha_1$ and $\beta_2$ align with a secondary yoke front end 91a of the secondary yoke 91. Rear ends of each of the signal coils $\alpha_1$ and $\beta_2$ align with a secondary magnet rear end 73f of the secondary magnets 73.

Front ends of each of the signal coils $\alpha_2$ and $\beta_1$ align with a secondary magnet front end 73e of the secondary magnets 73. Rear ends of each of the signal coils $\alpha_2$ and $\beta_1$ align with a secondary yoke rear end 91b of the secondary yoke 91. In other words, the signal coils $\alpha_1$, $\alpha_2$, $\beta_1$ and $\beta_2$ are axially arranged in a stagger way and axially aligned with the front and the rear ends of the secondary magnets 73.

The positions of the electric angle and the space angle of the above-mentioned signal coil pairs 92 are obtained by a magnet alignment point 911 which is positioned on the secondary yoke rear end 91b of the secondary yoke 91 and corresponds to the center of the signal coils $\alpha_1$. The electric angle and the space angle of the magnet alignment point 911 are 90 degrees and 22.5 degrees, respectively so that it is favorable for repairing and exchanging the monitor set 93 conveniently.

The differences of the electric included angles and the space included angles between the three hall sensors 94 are 120 degrees and 30 degrees, respectively. The hall sensor 94, at the center position among the three, is installed at the inner center of the signal coils $\alpha_2$, and the electric included angle and the space included angle of the center hall sensor 94 are 90 degrees and 202.5 degrees, respectively. The other two hall sensors 94, whose the difference of the electric included angle is 120 degrees, is installed at two opposite side of an exterior surface of the signal coils $\alpha_2$, respectively.

The axial length of the secondary yoke 91 is greater than the total axial length of the arranged signal coil pairs 92, and the signal coil pairs 92 completely located between the secondary yoke front end 91a and the secondary yoke rear end 91b for ensuring that when the inner rotor 7 is moved axially, the magnetic flux lines of the secondary magnetic loop of the secondary magnets 73 may be stable without deformation or bending, maintaining itself to be distributed on the surface of the secondary yoke 91 stably, thereby ensuring the stability and linearity of a voltage signal of the signal coil pairs 92. The axial movement and the radial movement of the inner rotor 7 can be calculated from the difference value of these voltage signals of the signal coil pairs 92. When the amount of movement exceeds the axial free space or a gap of the ceramic bearing 79, it shows that the wear of the front thrust bearing 53 and the ceramic bearing 79 happens and the amount of the wears can be calculated. When the movement exceeds a wear warning value, a warning notice must be transmitted, and when the movement exceeds a wear limit value, the operation of the pump must be stopped.

The method for calculating the wear of the front thrust bearing 53 and the ceramic bearing 79 is the same as the sixth embodiment. When the inner rotor 7 rotates and the axial movement happens, the magnetic flux lines of the secondary magnetic loop is stable without deformation or bending for ensuring the stability of voltage signal of the hall sensors 94 so that a drive including the monitor sensor 9 for driving the canned pump is provided.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A permanent magnet motor pump comprises a pump casing, an impeller, a containment shell, a stationary shaft, a motor and a monitor device, wherein:

the pump casing includes an inlet, an outlet and a flow channel, and is used for containing the impeller, a front thrust ring, installed on an inner side of the inlet of the pump casing, is used for mating with a front thrust bearing of the impeller to form a front axial thrust bearing together;

the impeller is assembled in the pump casing, a hub plate is used for combining an axially extended part of an inner rotor of the motor so that the impeller and the inner rotor are integrated into one piece or embedded to be combined into one piece;

the containment shell is a cup-shaped shell structure comprising a rear shaft support positioned on a bottom side of the containment shell, and a concave aperture on an outer side of the containment shell, the concave aperture has a ring-shaped surface for installing the monitor device which is used for detecting a mechanical wear of a ceramic bearing, a rear thrust ring is installed on a front surface of a shaft hold hole and is used for mating with the ceramic bearing of the inner rotor to form a rear axial thrust bearing; a shell flange part is positioned on a front side of the containment shell and combined with the pump casing and a pump side flange of the motor; a shell column part is on a lateral side of the containment shell and passes through the inner side of a stator of the motor with a loose slide fit, a motor rear casing of the motor is combined with the bottom side of the containment shell;

the stationary shaft is made of a ceramic material, the stationary shaft mates with the ceramic bearing for supporting a rotation of the inner rotor; the stationary shaft is installed on a shaft metal rear support of the motor rear casing, mates with the ceramic bearing to support the rotation of the inner rotor;

the motor comprises the stator, a motor casing, the motor rear casing and the inner rotor;

the stator is fixed in the motor casing, windings are winded on the stator, a PWM electric power is applied on the windings and generates a magnetic flux to interact with a magnetic flux of the inner rotor to generate torque and drive the impeller, the containment shell prevents the windings of the stator from being corroded by a corrosive fluid;

the motor casing has the pump side flange used for fixing with the shell flange part and the pump casing to prevent a leakage from the corrosive fluid, a back flange of the motor casing is used for fixing the motor rear casing with the shaft metal rear support;

the motor rear casing is fixed on the back flange of the motor casing, the shaft metal rear support positioned at a center of the motor rear casing, and is combined with the rear shaft support to form the metal holding support; and the inner rotor which is installed in an inner space of the containment shell is a ring-shaped structure comprising main magnets, a rotor yoke and the axially extended part, the main magnets are installed on an outer surface of the rotor yoke with a symmetric angular positions, the inner rotor is covered with an engineering plastic with anti-corrosion property, the ceramic bearing is installed in a central hole of the inner rotor for mating with the stationary shaft to bear a composite force, the axially extended part combines with the hub plate of the impeller so that the impeller and the inner rotor are integrated into one piece or embedded to be combined with each other into one piece;

an inner space of the rotor yoke contains the rear shaft support of the containment shell and the shaft metal rear support of the motor rear casing, which extend inwardly and axially in the inner space, an inner surface of the rotor yoke close to the bottom side of the containment shell is used for installing a plurality of secondary magnets, and each of the secondary magnets and each of the main magnets which are back to back to each other, have same magnetic pole in a radial direction of the stationary shaft;

the monitor device comprises the plurality of secondary magnets and a monitor set;

a number of the secondary magnets is the same as main magnets, the secondary magnets are assembled at one end of an inner side of the rotor yoke of the inner rotor of the bottom side of the containment shell, the secondary magnets are encapsulated with the main magnets in the inner rotor to prevent from being corroded by the corrosive fluid; an axial length of the secondary magnets is at least more than twice as great as a length of an axial movement of the inner rotor, the length of the axial movement equals to a length of a rear axial free space between the ceramic bearing and the rear thrust ring, a magnetic flux line emitted from a surface of one of the plurality of secondary magnets forms a secondary magnetic loop which coexists with a main magnetic loop in the rotor yoke; and the monitor set comprises a ring-shaped secondary yoke and multiple monitor elements, the monitor elements are installed on a surface of the ring-shaped secondary yoke with ferromagnetic material, and the secondary yoke and the multiple monitor elements are encapsulated as a set with an isolating material; the inner side of the secondary yoke is fixed with an outer-diameter surface of the shaft metal rear support; a secondary magnetic pole alignment point is positioned on a rear end of the secondary yoke and connected to an axis alignment point of the shaft metal rear support or the shaft metal rear support and a magnetic pole alignment point of a winding stator of the stator; a front axial end and a rear axial end of the secondary magnets do not exceed a front axial end and a rear axial end of the secondary yoke, the monitor elements cut the magnetic flux lines to output voltage signals while the inner rotor rotates.

2. The permanent magnet motor pump according to claim 1, wherein an axial width of a front axial free space must be greater than a sum of an amount of wear allowance of the front thrust ring and the front thrust bearing, and a width of an axial gap is increased accordingly when the front axial free space is reduced.

3. The permanent magnet motor pump according to claim 1, wherein a width of an axial gap must be greater than a total amount of the rear axial free space, and a mate wear of the surface of the ceramic bearing and the surface of the rear thrust ring.

4. The permanent magnet motor pump according to claim 1, wherein a number of the monitor elements is even and at least four, the axial length of each the monitor elements is not less than a sum of the length of the secondary magnets and the length of an axial free-movement, including a limit value of a wear of the front thrust bearing, of the inner rotor, and a width of a circumference of the monitor elements is not greater than an arc length between adjacent two center points of two secondary magnets.

5. The permanent magnet motor pump according to claim 4, wherein the monitor elements are signal coil pairs, the monitor set comprises the secondary yoke and the multiple signal coil pairs, and the axial movement of the inner rotor, a radial movement of the inner rotor and an angle of the inner rotor are obtained by calculating an electromotive voltage signal.

6. The permanent magnet motor pump according to claim 1, wherein a number of the monitor elements is even and at least four, the axial length of each the monitor elements is not less than a sum of the length of the secondary magnets and an axial free-movement, including a limit value of a wear of the front thrust bearing, of the inner rotor, and a width of a circumference of the monitor elements is not greater than an arc length between adjacent two center points of two secondary magnets.

7. The permanent magnet motor pump according to claim 6, wherein the monitor elements are signal coil pairs, the monitor set comprises the ring-shaped secondary yoke and the multiple signal coil pairs, and the axial movement of the inner rotor, a radial movement of the inner rotor and an angle of the inner rotor are obtained by calculating an electromotive voltage signal.

8. The permanent magnet motor pump according to claim 1, wherein the monitor elements are signal coil pairs, the monitor set comprises the ring-shaped secondary yoke and the multiple signal coil pairs, the multiple signal coil pairs are installed and arranged on the surface of the ring-shaped secondary yoke, and along a circumferential direction, the signal coil pairs are divided into two groups which are signal coils α and β, and a phase difference of an electric included angle between the two groups is 90 or 270 degrees; the positioning of the electric included angle and a space included angle of the signal coil pairs are obtained by a magnet alignment point of the ring-shaped secondary yoke which is used for repairing and exchanging the monitor set.

9. The permanent magnet motor pump according to claim 8, wherein the axial movement of the inner rotor, a radial movement of the inner rotor and an angle of the inner rotor are obtained by calculating an electromotive voltage signal.

10. The permanent magnet motor pump according to claim 8, wherein each of the signal coil pairs is arranged to cover at least more than a half of the axial length of the ring-shaped secondary yoke, each front and rear end of the signal coil pairs is adjacent to each other respectively.

11. The permanent magnet motor pump according to claim 8, wherein each of the signal coil pairs is arranged to cover at least more than a half of the axial length of the ring-shaped secondary yoke, each front and rear end of the signal coil pairs are staggered to each other.

12. The permanent magnet motor pump according to claim 8, wherein each of the signal coil pairs is arranged to cover at least more than a half of the axial length of the ring-shaped secondary yoke, each signal coil pairs are arranged in the space included angle of 180 degrees.

13. The permanent magnet motor pump according to claim 8, wherein the axial length of the ring-shaped secondary yoke is greater than a total axial length of the arranged signal coil pairs, the signal coil pairs completely located between the front end and the rear end of the ring-shaped secondary yoke, and a range of a axial movement of second magnets of the inner rotor does not exceed the axial length of the ring-shaped secondary yoke.

14. The permanent magnet motor pump according to claim 1, wherein the monitor elements comprises multiple signal coil pairs and multiple hall sensors, the multiple signal coil pairs are installed on the surface of the ring-shaped secondary yoke, and along a circumferential direction, the signal coil pairs are divided into two groups which are signal coils α and β, and a phase difference of an electric included angle between the two groups is 90 or 270 degrees; the position of the electric included angle and a space included angle of the signal coil pairs are obtained by a magnet alignment point of the secondary yoke which is used for repairing and exchanging the monitor set; phase differences of electric included angles of three hall sensors are 120 degrees, respectively, one of the hall sensors which is at a center position is installed and faces a center of one of the signal coil pairs, phase differences of electric included angles of another two of the hall sensors located out of the signal coil pairs are 120 degrees.

15. The permanent magnet motor pump according to claim 1, wherein the stationary shaft is double-sided-supported stationary shaft structure, the rear shaft support of the containment shell is a blank rear shaft support, the blank rear shaft support has a ring slot, there is no through hole on the blank rear shaft support; the blank rear shaft support is positioned at a center of the bottom side of the containment shell and extends inwardly and axially to the inner space of the rotor yoke; the blank rear shaft support includes the shaft hold hole protruding inwardly, and a ring slot opening on an outer side of the shaft hold hole; a front side of the stationary shaft is supported by a triangle front support, which installed at the inlet of the pump casing, the stationary shaft mates with the ceramic bearing for supporting the rotation of the inner rotor.

16. The permanent magnet motor pump according to claim 1, wherein the stationary shaft is a single-sided-supported cantilever stationary shaft structure, the rear shaft support of the containment shell has a rear shaft seat with a hole; the rear shaft seat is combined with a composited shaft metal rear support to form a metal composited support, an outer ring-shaped surface of the composited shaft metal rear support is used for installing the ring-shaped secondary yoke, and a seal surface of the rear shaft seat is combined by a surface of a ceramic shaft sleeve including an O ring and the composited shaft metal rear support makes no leakage; a composited stationary shaft comprises the ceramic shaft sleeve, a metal shaft and the motor rear casing, an end of the composited stationary shaft is installed on the composited shaft metal rear support of the motor rear casing, mates with the ceramic bearing to support the rotation of the inner rotor;

the metal shaft passes through a sleeve central hole of the ceramic shaft sleeve, and includes a circular head which is positioned at an end of the metal shaft covered with a resin enclosure, and pressed against a front end surface of the ceramic shaft sleeve, a teeth part of the metal shaft passes through the rear shaft seat of the containment shell and a central hole of the composited shaft metal rear support of the motor rear casing which is extended inwardly in a radial direction, a nut of the teeth part is fixed on the motor rear casing so that two ends of the ceramic shaft sleeve are pressed against the circular head and the composited shaft metal rear support to form the high-stiffness composited stationary shaft; a sliding thrust surface of the ceramic shaft sleeve is pressed against a surface of the composited shaft metal rear support, and a respective O rind is installed at each of the two ends of the ceramic shaft sleeve to form a sealing system.

\* \* \* \* \*